US006956317B2

(12) United States Patent
Namerikawa et al.

(10) Patent No.: US 6,956,317 B2
(45) Date of Patent: Oct. 18, 2005

(54) PIEZOELECTRIC/ELECTROSTRICTIVE DEVICE AND PIEZOELECTRIC/ELECTROSTRICTIVE ELEMENT

(75) Inventors: Masahiko Namerikawa, Seto (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 67 days.

(21) Appl. No.: 10/448,999

(22) Filed: May 30, 2003

(65) Prior Publication Data

US 2003/0227234 A1 Dec. 11, 2003

(30) Foreign Application Priority Data

Jun. 5, 2002 (JP) ....................................... 2002-164135
Oct. 31, 2002 (JP) ....................................... 2002-318073

(51) Int. Cl.[7] ................................................ H01L 41/08
(52) U.S. Cl. ....................... 310/331; 310/332; 310/340; 310/346
(58) Field of Search ................................ 310/328, 330, 310/331, 332, 358, 359, 340, 346; H03H 42/08

(56) References Cited

U.S. PATENT DOCUMENTS 6,504,287 B2 * 1/2003 Yun et al. .................... 310/328
6,796,011 B2 * 9/2004 Takeuchi et al. ............ 310/328

FOREIGN PATENT DOCUMENTS

JP 10-136665 5/1998
JP 2001-320103 11/2001

* cited by examiner

*Primary Examiner*—Mark Budd
(74) *Attorney, Agent, or Firm*—Burr & Brown

(57) ABSTRACT

A piezoelectric/electrostrictive device is provided, including a pair of mutually confronting thin plate portions, a fixing portion for supporting the pair of thin plate portions, movable portions provided at tip end portions of the pair of thin plate portions and having mutually confronting end surfaces, and piezoelectric/electrostrictive elements disposed on respective thin plate portions 12*a* and 12*b*. At least both side surfaces of the thin plate portions and the piezoelectric/electrostrictive elements are covered with coating films made of a material with a low thermal expansion coefficient.

11 Claims, 16 Drawing Sheets

75
79b
74
43

74
43
79a 300
312
314
320
x 8
334
341
342
343
369
371
372
373a
373b
374
376
377
378

PIEZOELECTRIC/ELECTROSTRICTIVE DEVICE AND PIEZOELECTRIC/ ELECTROSTRICTIVE ELEMENT

BACKGROUND OF THE INVENTION AND RELATED ART STATEMENT

The present invention relates to a filmy piezoelectric/electrostrictive element, a piezoelectric/electrostrictive device having movable portions that are operated based on a displacing operation of the piezoelectric/electrostrictive element, and a production method thereof. Specifically, the present invention relates to a piezoelectric/electrostrictive element that is excellent in temperature characteristic to enable a displacement control with high accuracy at high temperatures, and that is not subjected to deterioration even at high temperature and high humidity thereby to enable realization of a stable displacing operation over a long term, and further relates to a piezoelectric/electrostrictive device provided with the piezoelectric/electrostrictive element, and a production method thereof.

In recent years, in the fields of optical and precision apparatuses, semiconductor production, and so on, there has been a demand for displacement control elements that adjust optical path lengths, positions, etc. in the order of submicrons. In response thereto, there have been developed piezoelectric/electrostrictive elements that utilize distortion caused by an inverse piezoelectric effect or an electrostrictive effect generated upon applying an electric field to a ferroelectric body or antiferroelectric body. These displacement control elements utilizing the electric field induced distortion have features that it is easy to execute a small displacement control as compared with a conventional electromagnetic technique using servomotors, pulse motors, etc., the mechanical/electrical energy conversion efficiency is high so that power saving may be achieved, ultra-precise mounting is made possible, reduction in size and weight of the product can be achieved, and so on. Therefore, it is expected that application fields will be expanded steadily.

As such a displacement control element, for example, JP-A-10-136665 discloses a piezoelectric actuator wherein, as shown in FIG. 11, a plate-like member 200 made of a piezoelectric/electrostrictive material is provided with a hole portion 202, and a fixing portion 204, a movable portion 206, and beam portions 208 supporting them are formed integral with each other, and further, an electrode layer 210 is provided on the beam portion 208.

In this piezoelectric actuator, when an voltage is applied to the electrode layer 210, the beam portion 208 is extended/contracted in a direction of connecting the fixing portion 204 and the movable portion 206, so that it is possible to cause the movable portion 206 to perform arc-shaped displacement or rotational displacement in the plane of the plate-like member 200.

However, in the piezoelectric actuator disclosed in JP-A-10-136665, since the displacement in the extending/contracting direction of the piezoelectric/electrostrictive material (i.e. in-plane direction of the plate-like member 200) is transmitted to the movable portion 206 as it is, there has been a problem that an operation amount of the movable portion 206 is small. Further, since the piezoelectric actuator is entirely formed of the piezoelectric/electrostrictive material that is fragile and relatively heavy, it is low in mechanical strength, and inferior in handleability, impact resistance, and moisture resistance and, in addition, the piezoelectric actuator itself is heavy so that there has been a problem that it is susceptible to influence of harmful vibration (e.g. residual vibration or noise vibration upon high-speed operation) upon operation.

We have newly developed a piezoelectric/electrostrictive device provided with movable portions that are operated based on a displacing operation of a piezoelectric/electrostrictive element being a displacement control element, and proposed in JP-A-2001-320103 along with its production method, thereby to solve the aforementioned problem. This piezoelectric/electrostrictive device comprises a pair of mutually confronting thin plate portions and a fixing portion supporting these thin plate portions, wherein movable portions are provided at tip end portions of the pair of thin plate portions, and one or more piezoelectric/electrostrictive elements are disposed on at least one of the pair of thin plate portions, and is characterized in that the movable portions have mutually confronting end surfaces, and a distance between the end surfaces is greater than a length of the movable portion.

SUMMARY OF THE INVENTION

The present invention has been made to further improve the aforementioned our proposal. Specifically, the aforementioned previously proposed piezoelectric/electrostrictive device comprising the thin plate portions having the movable portions at the tip end portions thereof, and the fixing portion supporting them wherein the piezoelectric/electrostrictive elements are disposed on the thin plate portions, can be preferably used as, for example, an actuator for finely positioning a head element of a magnetic disk, an optical disk, or the like, and is an excellent small displacement control element.

However, recently, following the increasing capacity and density of magnetic disks and optical disks, there has been raised a demand for further improving the limit of positioning accuracy, and it has been unable to fully satisfy such a demand with the previously proposed piezoelectric/electrostrictive device as it is.

It has been considered that the limit of positioning accuracy of the previously proposed piezoelectric/electrostrictive device is induced by the use environment. Specifically, when used for the aforementioned purposes, the change in temperature is large and the temperature becomes high in the environment of use. Accordingly, it has been considered that, due to the temperature characteristics of the material forming the thin plate portions (vibration plates) or of a piezoelectric or electrostrictive material, or the like, or caused by the fact that a stress remains in piezoelectric/electrostrictive layers of the piezoelectric/electrostrictive elements due to a difference between a temperature upon production process and a temperature upon use, the piezoelectric/electrostrictive device does not produce expected displacement, which should follow an applied electric field, and displaces largely, for example, and therefore, it is difficult to achieve a small displacement control with ultra-high accuracy.

More specifically, in case of, for example, PZT being the typical piezoelectric material, the thermal expansion coefficient thereof is $1.4\times10^{-6}/°$ C., while the thermal expansion coefficient of metal (e.g. ferrous alloy such as various stainless steel or spring steel, copper alloy such as brass or beryllium copper, aluminum alloy such as duralumin) excellent in mechanical characteristic, or high-strength ceramics (e.g. alumina, partially stabilized zirconia), which is used as a material forming the thin plate portions, or an electrode material, is $7.5\times10^{-6}/°$ C. or greater. Therefore, following the change in temperature of the ambient environment or the element itself, a stress is generated between the piezoelectric material and the electrode material, and the thin plate portions, so that displacement thereof is changed to manifest unexpected displacement.

The reason thereof is that, upon forming the piezoelectric element on the thin plate portion, the process temperature of about 100 to 150° C. is applied when using thermosetting epoxy adhesive agent that provides high adhesion strength, while, the process temperature of 1000° C. or higher is applied when performing firing for integration. Therefore, if the temperature upon use for the aforementioned purpose is around room temperature, a stress remains due to that difference in temperature. Accordingly, there has arisen necessity for solving them, and the present invention has been reached.

Therefore, an object of the present invention is to solve the aforementioned problems and, in other words, to provide a piezoelectric/electrostrictive device that produces displacement following an applied electric field irrespective of changes in the use environment temperature or the element itself, or even upon use at high temperatures, thereby to enable a small displacement control with ultra-high accuracy. As a result of continuing intensive study about a method for suppressing displacement that becomes larger than a control value following the rise of temperature with respect to the piezoelectric/electrostrictive element forming the piezoelectric/electrostrictive device, it has been found that the aforementioned object can be accomplished by means shown below.

Specifically, according to the present invention, there are first provided the following two piezoelectric/electrostrictive devices.

The first piezoelectric/electrostrictive device comprises a pair of mutually confronting thin plate portions, and a fixing portion supporting the pair of thin plate portions, wherein movable portions are provided at tip end portions of the pair of thin plate portions, the movable portions have mutually confronting end surfaces, and one or more piezoelectric/electrostrictive elements are disposed on at least one of the pair of thin plate portions, and is characterized in that at least both side surfaces of the thin plate portions and the one or more piezoelectric/electrostrictive elements are covered with coating films made of a material with a low thermal expansion coefficient.

Here, there is no limitation to the low thermal expansion coefficient material as long as it is a material having a smaller thermal expansion coefficient than a piezoelectric/electrostrictive material forming the piezoelectric/electrostrictive element because the piezoelectric/electrostrictive device excellent in temperature characteristic can be obtained. For obtaining the piezoelectric/electrostrictive device with better temperature characteristic, it is preferable to use a material selected from the group consisting of $Mo_2O_3$, $Nb_2O_5$, $U_3O_8$, $PbTiO_3$, $SrZrO_3$, $SiO_2$, $SiO_2$ added with a trace amount of $TiO_2$, and cordierite.

The second piezoelectric/electrostrictive device comprises a pair of mutually confronting thin plate portions, and a fixing portion supporting the pair of thin plate portions, wherein movable portions are provided at tip end portions of the pair of thin plate portions, the movable portions have mutually confronting end surfaces, and one or more piezoelectric/electrostrictive elements are disposed on at least one of the pair of thin plate portions, and is characterized in that at least both side surfaces of the thin plate portions and one or more piezoelectric/electrostrictive elements are covered with coating films formed using polysilazane. The coating film formed using polysilazane is converted into a film formed of substantially $SiO_2$ only, and thus becomes a film with a lower thermal expansion coefficient as compared with the piezoelectric/electrostrictive element.

In the production of the piezoelectric/electrostrictive device, when the piezoelectric/electrostrictive element is formed on, for example, a later-described ceramic stacked body (obtained by stacking ceramic green sheets and firing them for integration), an internal residual stress is generated in the piezoelectric/electrostrictive element. Particularly, when the piezoelectric/electrostrictive element is formed into the ceramic stacked body by firing for integration, the internal residual stress is liable to occur in the piezoelectric/electrostrictive element due to a difference in contraction and thermal expansion coefficient of the constituent members generated upon firing.

When the use of the piezoelectric/electrostrictive device is started from this state, depending on the temperature of the ambient environment or the element itself upon use, there are those instances where the displacement following the control does not occur in the movable portions when the predetermined electric field is applied to piezoelectric/electrostrictive layers forming the piezoelectric/electrostrictive element.

A cause of this phenomenon can be considered such that due to a difference between a temperature upon production and a temperature upon use, influence of the internal residual stress generated upon production changes. Specifically, the internal residual stress is large at room temperature so that the original displacing characteristic of the piezoelectric/electrostrictive material is suppressed, while, as the using temperature increases, the internal residual stress is lowered so that the displacement of the movable portion becomes large.

In the first and second piezoelectric/electrostrictive devices according to the present invention, since at least both sides of the thin plate portions and the piezoelectric/electrostrictive elements are covered with the coating films of the low thermal expansion coefficient material, a new stress is generated between the low thermal expansion coefficient film and the piezoelectric/electrostrictive element as the temperature increases to high, so as to suppress the increase of excessive displacement of the piezoelectric/electrostrictive element at high temperatures. Therefore, even at high temperatures, it is possible to obtain a displacing operation of the movable portion that approximates a design value and thus is highly accurate.

In the first and second, piezoelectric/electrostrictive devices according to the present invention, it is preferable that a space is formed between the mutually confronting end surfaces of the movable portions. Since a portion of the movable portion, including one of the end surfaces, and another portion of the movable portion, including the other end surface, become liable to bend, the deformation resistance increases so that handleability of the piezoelectric/electrostrictive device improves. Further, it is possible to achieve a reduction of the weight of the movable portions, and thus, it becomes possible to increase the resonance frequency without reducing the displacement amount of the movable portions. Accordingly, it is possible to achieve both a large displacement of the movable portions and a (higher resonance frequency) the displacing operation of the movable portions. For further reducing the weight, it is preferable to shorten the overall length of the movable portions as represented by movable portions 42 shown in FIG. 22.

In the first and second piezoelectric/electrostrictive devices according to the present invention, like the previous proposal (See JP-A-2001-320103), the movable portions, the fixing portion, and the thin plate portions may be made of ceramic or metal. It is possible to form the respective portions of a ceramic material, or it is possible to form the respective portions of a metal material. Further, it is also possible to form a hybrid structure wherein the portions made of a ceramic material and the portions made of a metal material are combined together.

Normally, the pair of mutually confronting thin plate portions is made of a material having a higher thermal expansion coefficient than the piezoelectric/electrostrictive material forming the piezoelectric/electrostrictive elements. For example, zirconia or stainless steel may be used.

More preferably, in the first and second piezoelectric/electrostrictive devices according to the present invention, the thin plate portions, the movable portions, and the fixing portion are formed by a ceramic base body obtained by simultaneously firing ceramic green laminates so as to be integrated.

In the first and second piezoelectric/electrostrictive devices according to the present invention, it is preferable that the piezoelectric/electrostrictive elements are integrated with the ceramic base body through firing, and it is preferable that the piezoelectric/electrostrictive element is in the form of a film, and has a piezoelectric/electrostrictive layer and a pair of electrodes formed on the piezoelectric/electrostrictive layer. It is preferable that the piezoelectric/electrostrictive element is formed by stacking a plurality of the piezoelectric/electrostrictive layers and a plurality of pairs of the electrodes. With this arrangement, the generating power of the piezoelectric/electro-strictive element is increased so that a large displacement can be achieved. Further, since the rigidity of the device itself is enhanced, a higher resonance frequency can be achieved so that a speed-up of the displacing operation can be easily accomplished.

It may also be arranged that one of the pair of electrodes is formed on at least the thin plate portion. This makes it possible that vibrations caused by the piezoelectric/electrostrictive element are efficiently transmitted to the movable portion via the thin plate portion, so that the response property can be improved.

The piezoelectric/electrostrictive device according to the present invention can be used as an active element such as a transducer, an actuator, a frequency region functioning component (filter), a transformer, a vibrator or a resonator for communication or power, an oscillator or a discriminator, or as a sensor element for various sensors such as an ultrasonic sensor, an acceleration sensor, angular velocity sensor, an impact sensor and a mass sensor. Particularly, it can be suitably used for various actuators used in mechanisms for adjusting displacement, position and angle of various precision components of optical equipment, precision equipment etc.

Furthermore, according to the present invention, there are provided the following two piezoelectric/electrostrictive elements.

The first piezoelectric/electrostrictive element is in the form of a film and comprises a piezoelectric/electrostrictive layer and a pair of electrodes formed on the piezoelectric/electrostrictive layer, and is characterized in that at least a pair of side surfaces parallel to a displacing direction are covered with coating films formed using polysilazane. The coating film formed using polysilazane becomes a film formed of substantially $SiO_2$ only.

The second piezoelectric/electrostrictive element is in the form of a film and comprises a piezoelectric/electrostrictive layer and a pair of electrodes formed on the piezoelectric/electrostrictive layer, and is characterized in that at least a pair of side surfaces parallel to a displacing direction are covered with coating films made of substantially $SiO_2$ only and each having a thickness of 0.1 $\mu$m or greater.

The film made of only $SiO_2$ is a film having a lower thermal expansion coefficient as compared with the piezoelectric/electrostrictive element. Specifically, in the first and second piezoelectric/electrostrictive elements according to the present invention, at least a pair of side surfaces parallel to the displacing direction are covered with the films having the lower thermal expansion coefficient as compared with the piezoelectric/electrostrictive elements, so that, for example, as the temperature increases to high following the driving of the elements, the low thermal expansion coefficient film can suppress the temperature characteristic induced by a difference in thermal expansion coefficient between the piezoelectric material of the piezoelectric/electrostrictive elements and the electrode material. Therefore, even at high temperatures, it is possible to manifest the displacing amount that is more approximate to a design value and thus is highly accurate.

In the first and second piezoelectric/electrostrictive elements according to the present invention, it is preferable that a plurality of the piezoelectric/electrostrictive layers are provided, and the piezoelectric/electrostrictive layers and the electrodes are alternately stacked so that the electrodes are provided on an uppermost surface and a lowermost surface, and it is preferable that the piezoelectric/electrostrictive element is formed by stacking a plurality of the piezoelectric/electrostrictive layers and a plurality of pairs of the electrodes. With this arrangement, generating power of the piezoelectric/electrostrictive element is increased so that large displacement can be achieved. Further, since rigidity of the piezoelectric/electrostrictive element is more enhanced, higher resonance frequency can be achieved so that the speed-up of the displacing operation can be accomplished.

Further, according to the present invention, there is provided the first production method of producing a piezoelectric/electrostrictive device comprising a pair of mutually confronting thin plate portions, and a fixing portion supporting the pair of thin plate portions, wherein movable portions are provided at tip end portions of the pair of thin plate portions, the movable portions have mutually confronting end surfaces, and one or more piezoelectric/electrostrictive elements are disposed on at least one of the pair of thin plate portions, the method characterized by comprising a step of, after forming the one or more piezoelectric/electrostrictive elements on the at least one of the pair of thin plate portions, covering at least both side surfaces of the thin plate portions and the one or more piezoelectric/electrostrictive elements with coating films made of a low thermal expansion coefficient material by a film formation method. In this event, as the film formation method, there can be used a method such as sticking of a filmy plate separately prepared in advance, coating, dipping, sputtering, CVD, or laser ablation.

Further, according to the present invention, there is provided a method of producing a piezoelectric/electrostrictive element comprising a piezoelectric/electrostrictive layer and a pair of electrodes formed on the piezoelectric/electrostrictive layer, the method comprising a step of covering, by a film formation method, at least a pair of side surfaces parallel to a displacing direction with coating films made of substantially $SiO_2$ only and each having a thickness of 0.1 $\mu$m or greater. In this event, as the film formation method, it is preferable to adopt a coating method or a dipping method using a polysilazane.

Recently, as applied uses of the piezoelectric/electrostrictive element and the piezoelectric/electrostrictive device, in addition to the conventional floor-type magnetic disk drive or optical disk drive, there are increasing uses in those apparatuses that are susceptible to vibration or impact such as magnetic disk drives, optical disk drives, acceleration sensors, and angular velocity sensors for vehicle or mobile equipment, so that there are those instances where the mechanical strength is insufficient. The mechanical strength of the conventional piezoelectric/electrostrictive elements and piezoelectric/electrostrictive devices is set to a value lower than a value calculated from material values of the respective materials forming the piezoelectric/electrostrictive device. The reason thereof is considered that, in addition to the fact that a stress remains in the piezoelectric/electrostrictive layers and the thin plate portions (vibration plates) of the piezoelectric/electrostrictive elements due to a difference between a temperature upon production process and a temperature upon use, damages caused on the piezoelectric/electrostrictive elements or the thin plate potions (vibration plates) during the production process of the piezoelectric/electrostrictive device become notches, and the stress is concentrated to notch portions.

In the aforementioned piezoelectric/electrostrictive device and piezoelectric/electrostrictive element according to the present invention, the aforementioned notch portions are filled up by the coating film to smooth the surface so as to relax the concentration of the stress, so that it is possible to improve the mechanical strength. Further, when the coating film of the low thermal expansion coefficient material is formed at a temperature higher than the using temperature, a compressive stress remains in the coating film at the using temperature so that cracks are not easily generated in the coating film, while, even if the cracks are generated, development thereof is suppressed. Therefore, the mechanical strength can be improved resultantly.

The object of the present invention can also be accomplished by piezoelectric/electrostrictive devices obtained by the following production methods. The aforementioned first production method according to the present invention is means that can obtain the first and second piezoelectric/electrostrictive devices according to the present invention. On the other hand, the following second, third, and fourth production methods according to the present invention are not means for producing the piezoelectric/electrostrictive device covered with the coating films like the first and second piezoelectric/electrostrictive devices according to the present invention, but means for obtaining a piezoelectric/electrostrictive device wherein joining between the main constituent members is implemented by the diffusion joining method.

The second production method according to the present invention is a method of producing a piezoelectric/electrostrictive device comprising a thin plate portion and a fixing portion supporting the thin plate portion and formed with a cavity inside, wherein one or more piezoelectric/electrostrictive elements are disposed on the thin plate portion in a position corresponding to the cavity of the fixing portion, and is characterized by comprising the steps of preparing a joined body by joining a thin plate that becomes the thin plate portion later, and a thick plate that comprises at least one layer and becomes the fixing portion later, through diffusion joining; and forming the one or more piezoelectric/electrostrictive elements on the thin plate of the joined body.

The third production method according to the present invention is a method of producing a piezoelectric/electrostrictive device comprising a pair of mutually confronting thin plate portions and a fixing portion supporting the pair of thin plate portions, wherein one or more piezoelectric/electrostrictive elements are disposed on at least one of the pair of thin plate portions.

The third production method according to the present invention is characterized by comprising the steps of preparing a joined body by joining thin plates that become the thin plate portions later, and one or more thin plates or thick plates that become the fixing portion later, through diffusion joining; disposing the one or more piezoelectric/electrostrictive elements on at least one of the thin plates of the joined body to prepare an original piezoelectric/electrostrictive device; and cutting the original piezoelectric/electrostrictive device to obtain individual piezoelectric/electrostrictive devices.

The fourth production method according to the present invention is a method of producing a piezoelectric/electrostrictive device comprising a pair of mutually confronting thin plate portions, and a fixing portion supporting the pair of thin plate portions, wherein movable portions are provided at tip end portions of the pair of thin plate portions, the movable portions have mutually confronting end surfaces, and one or more piezoelectric/electrostrictive elements are disposed on at least one of the pair of thin plate portions.

The fourth production method according to the present invention is characterized by comprising the steps of preparing intermediate joined bodies each by joining a thin plate that becomes the thin plate portion later, and one or more thin plates or thick plates that become the movable portion and part of the fixing portion later, through diffusion joining; preparing a joined body by joining the intermediate joined bodies and one or more thin plates or thick plates that become the fixing portion later, through diffusion joining; disposing the one or more piezoelectric/electrostrictive elements on at least one of the thin plates of the joined body to prepare an original piezoelectric/electrostrictive device; and cutting the original piezoelectric/electrostrictive device to obtain individual piezoelectric/electrostrictive devices.

In the second to fourth production methods according to the present invention, it is preferable that the thin plate or thick plate that becomes at least part of the fixing portion later, is formed with a window portion in advance. Of course, it may also be arranged that all the plates including the thin plates that become the thin plate portions later have window portions.

The window portions are hole portions opened in the thin plates and, although not forming the components of the piezoelectric/electrostrictive device, they are necessary spaces for determining the shapes of the thin plate portions, and the fixing portion, for example, that are the components of the piezoelectric/electrostrictive device. Therefore, if no window portions are provided, thin plates having final shapes or having shapes closely approximate to the final shapes are joined together. In this case, depending on the shapes or materials used for the thin plates, there is possibility of deformation during the production process due to insufficient strength. On the other hand, the thin plates having the window portions are in the form of frame-shaped members, so that it is easy to ensure the strength and thus not easy to be deformed. The means for forming the window portions in the thin plates in advance is preferable when, for example, the thin plates are ceramic green sheets. On the other hand, if the thin plates are metal plates, the window portions may be formed in advance, or may not be formed, i.e. the metal plate with no window portions can also be used.

In the second to fourth production methods according to the present invention, all the thin plates and thick plates being the main constituent members are made of a material of the same kind for suppressing change in shape before and after the diffusion joining. Since the thin plates and thick plates being the main constituent members of the piezoelectric/electrostrictive device are joined together by the diffusion joining method to obtain the piezoelectric/electrostrictive device, joined portions are integrated with the members themselves so that reliability of the joining is quite high. Since there exist no materials of different kinds in the constituent members including the joined portions, a thermal stress caused by change in temperature is suppressed to minimum so that the temperature characteristic becomes excellent. Therefore, the produced piezoelectric/electrostrictive device enables a small displacement control with ultra-high accuracy even upon occurrence of change in temperature of the using environment or even upon use at high temperatures. Further, since no adhesive agent layers exist at the joined portions, the dimensional accuracy in the thickness direction is high.

In the second to fourth production methods according to the present invention, it is preferable that the thin plate or thick plate is made of a material of which a 0.2% proof stress at 800° C. is 75 MPa or greater. This is because deformation of the thin plate or thick plate (member to be joined) before and after the diffusion joining can be suppressed. FIG. 19 shows a relationship between the 0.2% proof stress at 800° C. of the typical metal material and the dimensional change (deformation) before and after the diffusion joining. As shown in FIG. 19, as materials that satisfy the aforementioned condition, an 18Cr-8Ni alloy (corresponding to SUS304), an 18Cr-8Nb alloy, and an 18Cr-8Mo alloy can be cited.

In the diffusion joining method, a member to be joined (a thin plate or thick plate, or an intermediate joined body obtained by joining a plurality of thin plates) is placed between two pressure dies and pressed at a predetermined temperature. In this event, it is preferable that the member to be joined is pressed in the state where pressure plates made of the same material as that of the member to be joined and applied with solid lubricant are interposed between the pressure dies and the member to be joined. By using the pressure plates made of the same material as that of the member to be joined, i.e. having the same thermal expansion coefficient, deformation of the member to be joined that is sandwiched between the pressure dies, can be prevented and, by applying the solid lubricant to the pressure plates, joining between the pressure plates and the member to be joined can be prevented. It is preferable that the solid lubricant contains at least hexagonal boron nitride. This is because, even at high temperature and under high pressure upon the diffusion joining, there occurs no reaction with or adhesion to the member to be joined.

In the aforementioned diffusion joining method, it is also preferable that the member to be joined is pressed in the state where ceramic pressure plates having a thermal expansion coefficient that is within a range of ±30% relative to a thermal expansion coefficient of the member to be joined, are interposed between the pressure dies and the member to be joined. This is because deformation of the thin plate or thick plate (member to be joined) before and after the diffusion joining can be suppressed. FIG. 20 shows the ratio of thermal expansion coefficient of the pressure plate relative to thermal expansion coefficient of the member to be joined, and the dimensional change (deformation) thereof before and after the diffusion joining. As shown in FIG. 20, if the thermal expansion coefficient of the pressure plate relative to the member to be joined is 70% or greater, i.e. if it is a (ceramic) pressure plate having a thermal expansion coefficient that is within the range of 30% relative to a thermal expansion coefficient of the member to be joined, the dimensional change can be suppressed to approximately 1% or less. It is preferable that the ceramic pressure plates are made of calcium oxide (CaO) or magnesium oxide (MgO) of 80% or more purity. If the purity is lower than it, the thermal expansion coefficient becomes extremely low so that deformation of the member to be joined before and after the diffusion joining becomes remarkable.

The aforementioned second, third, and fourth production methods of the piezoelectric/electrostrictive devices according to the present invention are common in using the diffusion joining method for joining the main constituent members, and any of them can be used along with the aforementioned first production method. Specifically, if the piezoelectric/electrostrictive devices obtained by the second, third, and fourth production methods are applied with the coating films of the low thermal expansion coefficient material by the film formation method such that at least both side surfaces of the thin plate portions and the piezoelectric/electrostrictive elements are covered with the coating films, the obtained piezoelectric/electrostrictive devices are each provided with highly excellent temperature characteristic.

Figure 1:
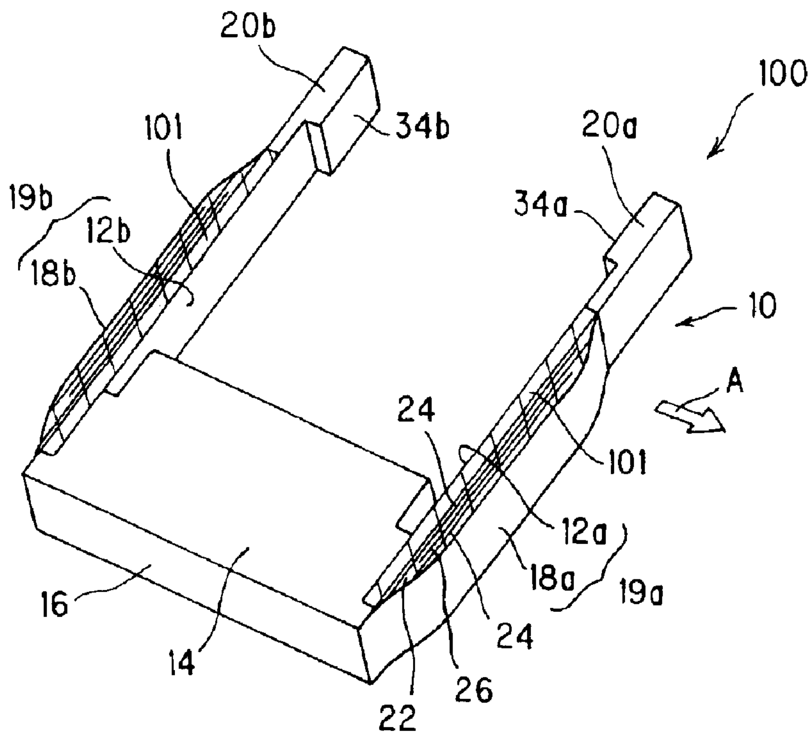
FIG. 1 is a perspective view showing an embodiment of a piezoelectric/electrostrictive device according to the present invention.

In the accompanying drawings, the numerical references have the meanings described below:

10,80,100,140,150,300: piezoelectric/electrostrictive device; 12*a*, 12*b*, 142, 312, 412: thin plate portion; 14,314, 414: fixing portion; 16: substrate; 18*a*, 18*b*, 78, 88, 178, 378: piezoelectric/electrostrictive element; 19*a*, 19*b*, 132: actuator portion; 20*a*, 20*b*, 320, 420: movable portion; 22: piezoelectric/electrostrictive layer; 24, 26: pair of electrodes; 34*a*, 34*b*, 334: end surface; 36: space; 41, 42, 43, 141, 341, 342, 343: window portion; 44: adhesive agent applying portion; 61, 62: thick plate; 63: cavity; 64: liquid draining hole; 65: rubber band; 69, 369: cutting line; 71, 72, 74, 171, 371, 372, 374: thin plate; 73*a*, 73*b*, 75: preliminary stacked body; 76, 174, 376: joined body; 77, 377: original piezoelectric/electrostrictive device; 79*a*, 79*b*, 373*a*, 373*b*: intermediate joined body; 81: filmy plate; 82: vibration plate; 91, 92, 101, 141, 151: coating film; 124: display element; 126: light source; 128: light; 130: optical waveguide plate; 134: driving portion; 140*a*: pixel forming member; 142: through hole; 161: pressure chamber; 162: liquid introducing port; 163: liquid discharging port; 170: droplet discharging device; 172, 173: thick plate; 181: pressure die; 182: pressure plate; 200: plate-like member; 202: hole portion; 204: fixing portion; 206: movable portion; 208: beam portion; 210: electrode layer; 221: magnetic head; 222, 223: joining portion.

DETAILED DESCRIPTION OF THE INVENTION

Embodiments of piezoelectric/electrostrictive devices, piezoelectric/electrostrictive elements, and methods for production thereof according to the present invention will be described hereinbelow with reference to examples shown in the accompanying drawings. However, the present invention should not be interpreted as being limited thereto, but can be added with various changes, alterations, and improvements based on knowledge of experts in the art without departing from the scope of the present invention.

In the following description, the aforementioned first and second piezoelectric/electrostrictive devices will be collectively referred to simply as the piezoelectric/electrostrictive device according to the present invention, and the aforementioned first and second piezoelectric/electrostrictive elements will be collectively referred to simply as the piezoelectric/electrostrictive element according to the present invention. Further, the piezoelectric/electrostrictive element according to the present invention can be a component of the piezoelectric/electrostrictive device according to the present invention.

A coating film made of polysilazane exhibits a peculiar effect as described later. In this specification, a coating film made of a material with a low thermal expansion coefficient includes the coating film made of polysilazane.

Further, in this specification, a piezoelectric/electrostrictive device represents a device that performs mutual conversion between electrical energy and mechanical energy by means of a piezoelectric/electrostrictive element. Therefore, the piezoelectric/electrostrictive device according to the present invention is most preferably used as an active element such as each of various actuators or vibrators, particularly as a displacement control element utilizing the displacement caused by an inverse piezoelectric effect or an electrostrictive effect and, in addition, preferably used as a passive element such as an acceleration sensor element or an impact sensor element.

The piezoelectric/electrostrictive device according to the present invention shown in the following embodiments is a piezoelectric/electrostrictive device that is obtained by applying a coating film with a low thermal expansion coefficient to a piezoelectric/electrostrictive device 10 shown in FIG. 3 and disclosed in JP-A-2001-320103, and is thus improved in temperature characteristic to manifest excellent displacement relative to a given electric field even at high temperatures.

First, this piezoelectric/electrostrictive device 10 will be described.

Figure 3:
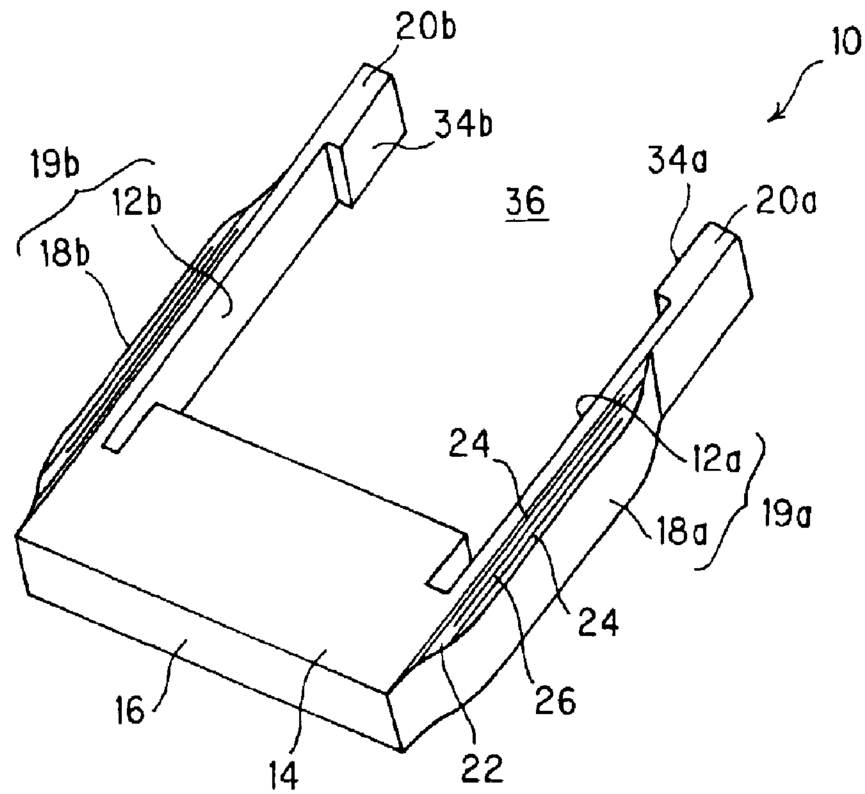
FIG. 3 is a perspective view showing an example of a conventional piezoelectric/electrostrictive device.

As shown in FIG. 3, the piezoelectric/electrostrictive device 10 comprises a base body 16 including a pair of mutually confronting thin plate portions 12*a* and 12*b* and a fixing portion 14 supporting these thin plate portions 12*a* and 12*b* that are formed integral with each other, and further comprises piezoelectric/electrostrictive elements 18*a* and 18*b* formed on portions of the pair of thin plate portions 12*a* and 12*b*, respectively.

The piezoelectric/electrostrictive device 10 is configured such that the pair of thin plate portions 12*a* and 12*b* are displaced by driving the piezoelectric/electrostrictive elements/element 18*a* and/or 18*b*, or the displacement of the thin plate portions 12*a* and 12*b* is detected by the piezoelectric/electrostrictive elements/element 18*a* and/or 18*b*. Namely, the thin plate portions 12*a* and 12*b* and the piezoelectric/electrostrictive elements 18*a* and 18*b* form actuator portions 19*a* and 19*b*, respectively.

Further, the tip end portions of each of the pair of thin plate portions 12*a* and 12*b* increase in thickness in an inward direction, and these thickness-increased portions serve as movable portions 20*a* and 20*b* that are displaced following the displacing operations of the thin plate portions 12*a* and 12*b*, respectively. Hereinafter, the tip end portions of the pair of thin plate portions 12*a* and 12*b* will be referred to as the movable portions 20*a* and 20*b*, respectively. A space 36 is interposed between mutually confronting end surfaces 34*a* and 34*b* of the movable portions 20*a* and 20*b*.

The base body 16 may be formed of ceramic or metal entirely, or may have a hybrid structure in combination of a member formed of ceramic and a member formed of metal. The base body 16 may adopt a structure wherein respective portions are joined together by a joining agent such as organic resin or glass, a ceramic integral structure wherein ceramic green laminates are integrated by firing, a metal integral structure wherein respective portions are integrated by diffusion joining, brazing, soldering, eutectic joining, welding, or the like. Inasmuch as substantially no time-domain change occurs in state, so that the reliability of joined portions is high, and that there is an advantage in ensuring rigidity, the base body 16 is preferably formed by a ceramic stacked body obtained by integrating the ceramic green laminates through firing.

The piezoelectric/electrostrictive elements 18*a* and 18*b* may be prepared as separate members and attached to the base body 16 by a joining agent such as organic resin or glass, brazing, soldering, eutectic joining, or the like. Alternatively, the piezoelectric/electrostrictive elements 18*a* and 18*b* may be formed directly on the base body 16 using the film forming method, not in the form of the attachment. More preferably, the base body 16 is formed as the ceramic stacked body, and the piezoelectric/electrostrictive elements 18*a* and 18*b* are integrated with the base body 16 by firing.

Now, the piezoelectric/electrostrictive device according to the present invention will be described.

The piezoelectric/electrostrictive device according to the present invention is obtained by covering at least both side surfaces of the thin plate portions and the piezoelectric/electrostrictive elements of the aforementioned piezoelectric/electrostrictive device 10 with coating films made of a material with a low thermal expansion coefficient. FIG. 1 shows one embodiment thereof. In a piezoelectric/electrostrictive device 100 according to the present invention, only both side surfaces of thin plate portions 12*a* and 12*b* and piezoelectric/electrostrictive elements 18*a* and 18*b* are covered with coating films 101 (hatched portions in the figure). Although a production method thereof will be described later, the coating films of the piezoelectric/electrostrictive device 100 can be formed by, for example, masking those portions other than such portions where the coating films are formed in the piezoelectric/electrostrictive device 10, i.e. other than both side surfaces of the thin plate portions 12*a* and 12*b* and the piezoelectric/electrostrictive elements 18*a* and 18*b*, and by implementing the film forming method such as sputtering, CVD or laser ablation (implementing twice because of both surfaces).

Each of the piezoelectric/electrostrictive elements 18*a* and 18*b* comprises filmy piezoelectric/electrostrictive layers 22 composed of four layers, and a pair of electrodes 24 and 26 formed on both surfaces of each piezoelectric/electrostrictive layer 22, and the electrodes 26 of the pairs of electrodes 24 and 26 are formed on the pair of thin plate portions 12*a* and 12*b* (i.e. on the lowermost surfaces) and on the uppermost surfaces of the piezoelectric/electrostrictive elements 18*a* and 18*b*.

Figure 2:
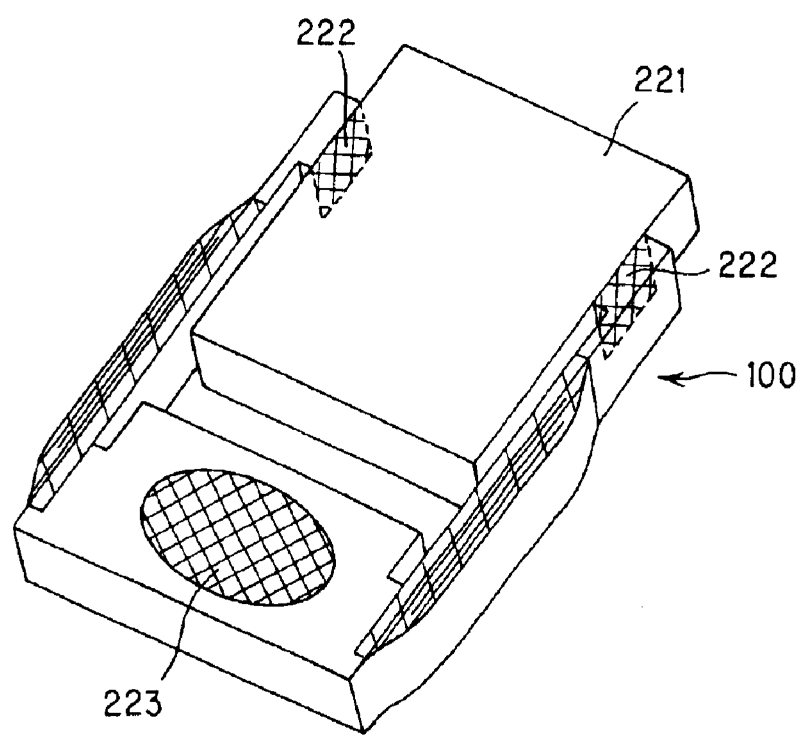
FIG. 2 is a perspective view showing the embodiment of the piezoelectric/electrostrictive device according to the present invention, wherein a component is attached.

In the piezoelectric/electrostrictive device 100, when, for example, a voltage is applied to the pairs of electrodes 24 and 26 of the piezoelectric/electrostrictive element 18*a*, the piezoelectric/electrostrictive layers 22 of the piezoelectric/electrostrictive element 18*a* are displaced by contraction in the principal plane direction thereof. As shown in FIG. 1, this causes the occurrence of a stress relative to the thin plate portion 12*a* in a bending direction (direction identified by arrow A) of the thin plate portion 12*a*, so that the thin plate portion 12*a* is bent in the direction identified by the arrow A. In this event, assuming that the movable portions 20*a* and 20*b* are coupled together via a magnetic head 221 interposed therebetween as shown in FIG. 2, and that the voltage is not applied to the pairs of electrodes 24 and 26 of the other piezoelectric/electrostrictive element 18*b*, the other thin plate portion 12*b* is also bent in the direction identified by the arrow A following the bend of the thin plate portion 12*a*. As a result, the movable portions 20*a* and 20*b* are displaced in the direction identified by the arrow A relative to a longitudinal axis of the piezoelectric/electrostrictive device 100.

As described above, the small displacement of the piezoelectric/electrostrictive elements 18*a* and 18*b* is amplified as the large displacing operation utilizing the bend of the thin plate portions 12*a* and 12*b* so as to be transferred to the movable portions 20*a* and 20*b*, so that the movable portions 20*a* and 20*b* can be largely displaced relative to the longitudinal axis of the piezoelectric/electrostrictive device 10.

Particularly, inasmuch as the space 36 is defined between the movable portions 20*a* and 20*b*, the weight reduction is further achieved so that the resonance frequency can be increased without reducing the displacement magnitude of the movable portions 20*a* and 20*b*. The frequency represents a frequency of voltage waveform when the voltage applied to the pairs of electrodes 24 and 26 is alternately switched to displace the movable portions 20*a* and 20*b* rightward and leftward, while the resonance frequency represents the maximum frequency at which the displacing operation of the movable portions 20*a* and 20*b* can follow in a predetermined vibration mode.

The displacement magnitude normally changes depending on a value of voltage applied to (or electric field given to) the piezoelectric/electrostrictive element. However, in the conventional piezoelectric/electrostrictive device, there have been those instances where the manifested displacement did not agree with a control at the movable portions due to the fact that an influence of internal residual stress generated upon production changes due to a difference in temperatures upon production and use. Specifically, the displacing operation of the movable portions sometimes became greater than a control value upon use at high temperatures.

In the piezoelectric/electrostrictive device 100 according to the present invention, inasmuch as both side surfaces of the thin plate portions 12*a* and 12*b* and the piezoelectric/electrostrictive elements 18*a* and 18*b*, i.e. the pair of side surfaces parallel to the displacing direction, are covered with the coating films 101 made of the material having the lower thermal expansion coefficient as compared with the piezoelectric/electrostrictive elements, the coating films 101 can suppress the excessive displacement of the piezoelectric/electrostrictive elements that is generated in the direction identified by the arrow A as the temperature increases. Therefore, the displacement magnitude of the movable portions can be controlled to a desired value even at the high temperatures, thereby to enable the piezoelectric/electrostrictive device 100 to operate accurately.

Inasmuch as the width of the thin plate portions 12*a* and 12*b* is basically constant even by increasing the driving force of the actuator portions 19*a* and 19*b*, the piezoelectric/electrostrictive device 100 is a highly preferable device when applied to, for example, an actuator for controlling a position of an optical disk pickup or a hard disk magnetic head that is used in a very narrow gap.

FIG. 2 shows the state wherein the hard disk magnetic head is attached to the piezoelectric/electrostrictive device 100 shown in FIG. 1. The magnetic head 221 is fixed in the space 36 by joining portions 222 (end surfaces 34*a* and 34*b*) of the movable portions 20*a* and 20*b*, while the piezoelectric/electrostrictive device 100 itself attached with the magnetic head 221 is fixed to a hard disk suspension at a joining portion 223. The joining portions 222 of the movable portions 20*a* and 20*b* are the mutually confronting end surfaces 34*a* and 34*b* each having a large surface area, so that the mountability of the magnetic head 221 onto the movable portions 20*a* and 20*b* is improved to enable the magnetic head 221 to be fixed securely. In a hard disk drive, positioning of the piezoelectric/electrostrictive device 100 is first carried out by a voice coil motor (VCM) or the like, then positioning of the magnetic head 221 is accurately carried out by the movable portions 20*a* and 20*b* that are displaced following the displacing operation of the piezoelectric/electrostrictive elements 18*a* and 18*b*.

Figure 4:
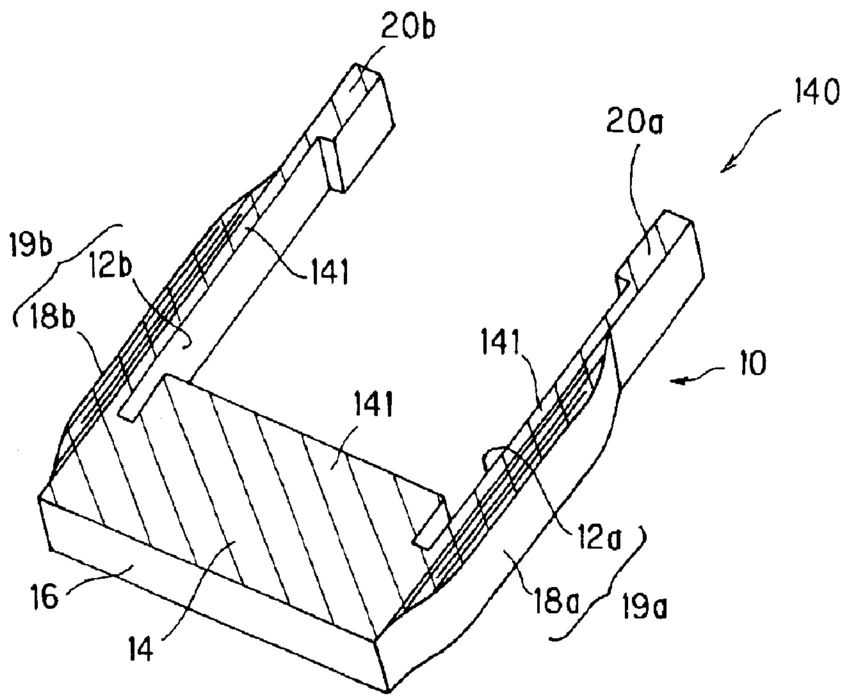
FIG. 4 is a perspective view showing another embodiment of a piezoelectric/electrostrictive device according to the present invention.
Figure 5:
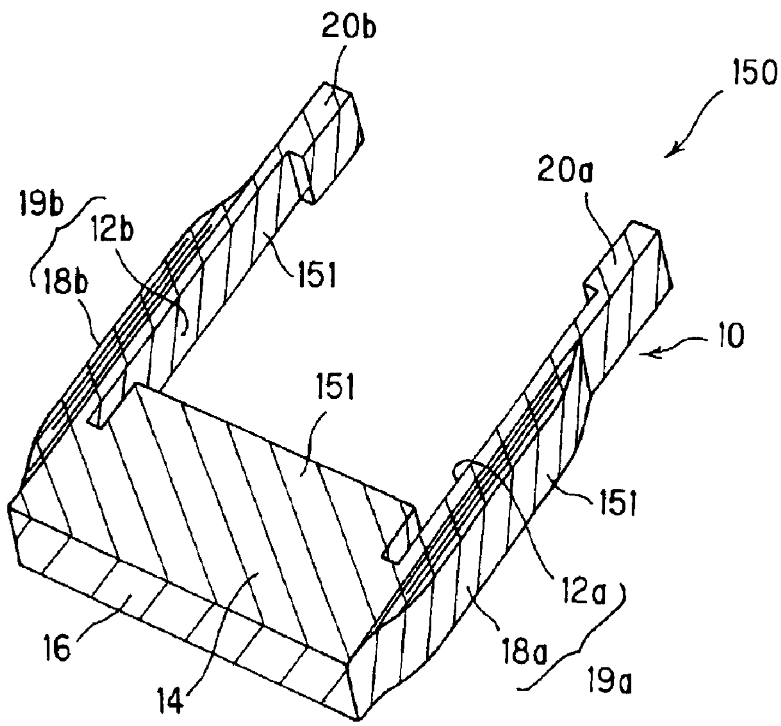
FIG. 5 is a perspective view showing still another embodiment of a piezoelectric/electrostrictive device according to the present invention.

Referring now to FIGS. 4 and 5, other embodiments of the piezoelectric/electrostrictive device according to the present invention will be described.

In a piezoelectric/electrostrictive device 140 shown in FIG. 4, both side surfaces of thin plate portions 12*a* and 12*b* including movable portions 20*a* and 20*b*, piezoelectric/electrostrictive elements 18*a* and 18*b*, and a fixing portion 14, i.e. all the side surfaces, are covered with coating films 141 (hatched portions in the figure) made of a material with a low thermal expansion coefficient. End surfaces are not formed with the coating films 141. The coating films of the piezoelectric/electrostrictive device 141 can be formed by, for example, implementing the film forming method such as sputtering, CVD or laser ablation (implementing twice because of both surfaces) like the piezoelectric/electrostrictive device 100.

In a piezoelectric/electrostrictive device 150 shown in FIG. 5, all the surfaces (end surfaces and side surfaces) of thin plate portions 12*a* and 12*b*, including movable portions 20*a* and 20*b*, piezoelectric/electrostrictive elements 18*a* and 18*b*, and fixing portion 14, are covered with coating films 151 (hatched portions in the figure) made of a material with a low thermal expansion coefficient. The coating films of the piezoelectric/electrostrictive device 150 can be easily formed by, for example, the dipping method or the coating method.

The coating film of the present invention serves not only as a film for suppressing the temperature characteristic, but also as a dampproof film for suppressing short circuit of a piezoelectric/electrostrictive element due to migration and corrosion of a metal base body and a metal thin plate portion at high temperature and high humidity, and breakage caused by phase transformation of a partially stabilized zirconia base body and thin plate portion, and as a dustproof film for suppressing generation of dust from a piezoelectric/electrostrictive device, which will be described later. Accordingly, it is preferable that more portions of the piezoelectric/electrostrictive device are coated. In view of this, the mode of the piezoelectric/electrostrictive device 140 is preferable to the mode of the piezoelectric/electrostrictive device 100, and further, the mode of the piezoelectric/electrostrictive device 150 is more preferable.

In each of the piezoelectric/electrostrictive devices 140 and 150, like in the piezoelectric/electrostrictive device 100, inasmuch as both side surfaces of the thin plate portions 12*a* and 12*b* and the piezoelectric/electrostrictive elements 18*a* and 18*b*, i.e. the pair of side surfaces parallel to the displacing direction, are covered with the coating films made of the material having the lower thermal expansion coefficient as compared with the piezoelectric/electrostrictive elements, the coating films suppress the excessive displacement of the piezoelectric/electrostrictive elements that is generated as the temperature increases, so that the piezoelectric/electrostrictive device follows the given electric field to manifest the desired displacement magnitude accurately even at high temperatures. Namely, the piezoelectric/electrostrictive device according to the present invention can achieve the certain effect as long as at least both side surfaces of the thin plate portions and the piezoelectric/electrostrictive elements are covered with the coating films made of the material having the lower thermal expansion coefficient as compared with the piezoelectric/electrostrictive elements.

In the piezoelectric/electrostrictive device 100, 140, 150 according to the present invention, it is sufficient that the material of the coating films has the lower thermal expansion coefficient as compared with the piezoelectric/electrostrictive elements as described above. On the other hand, for further improving the temperature characteristic, it is preferable to use one of materials like $Mo_2O_3$, $Nb_2O_5$, $U_3O_8$, $PbTiO_3$, $SrZrO_3$, $SiO_2$ $SiO_2$ added with a trace amount of $TiO_2$, and cordierite. These materials have thermal expansion coefficients of about 0.05 to $1.0\times10^{-6}$/° C., and are excellent in adhesion to a piezoelectric/electrostrictive material or an electrode material so that a coating film can be easily formed thereon.

Here, description will be given to effects that are achieved by the piezoelectric/electrostrictive device according to the present invention.

In the present invention, as described above, the first effect is that the temperature characteristic of the piezoelectric/electrostrictive device becomes excellent. Apart from it, according to the mode of the present invention, i.e. being the piezoelectric/electrostrictive device in which at least both side surfaces of the thin plate portions and the piezoelectric/electrostrictive elements are covered with the coating films made of the material having the lower thermal expansion coefficient as compared with the piezoelectric/electrostrictive elements, the following secondary effects are manifested.

The second effect is to prevent generation of particles. In the piezoelectric/electrostrictive device according to the present invention, since both side surfaces of the piezoelectric/electrostrictive elements are covered with the coating films, generation of particles at least from the side surfaces of the piezoelectric/electrostrictive elements can be suppressed, so that it is possible to reduce the generation of particles over a long term. The more preferable mode for reducing the generation of particles is the one shown in FIG. 5, wherein the entire piezoelectric/electrostrictive device, including the piezoelectric/electrostrictive elements, is covered with the coating films.

In general, when using a piezoelectric/electrostrictive element, since the piezoelectric/electrostrictive material itself is fragile, the probability is high that the piezoelectric/electrostrictive element itself is subjected to the occurrence of breakage or cracks. Therefore, particularly, if it is operated over a long term, the grain boundaries of crystals are exfoliated so that particles tend to be generated. No piezoelectric/electrostrictive materials have been found that are improved to substantially prevent long-term particle generation. Therefore, there is possibility that the aforementioned problem about the piezoelectric/electro-strictive element will directly lead to a serious problem depending on use thereof.

For example, when used for positioning a hard disk magnetic head as described above, generated particles may make the disk and/or head dirty, which may not only cause an error in the reading/writing operation, but may also induce breakage of an apparatus. If the piezoelectric/electrostrictive device according to the present invention is used, no such problem is raised.

The third effect is to improve durability of the piezoelectric/electrostrictive device. In the piezoelectric/electrostrictive device according to the present invention, inasmuch as both side surfaces of the piezoelectric/electrostrictive elements are covered with the coating films, even if the piezoelectric/electrostrictive device is used particularly in a high humidity atmosphere, invasion of moisture is suppressed so as to reduce the rate of occurrence of short circuit caused by migration or the like over a long term, so that high reliability can be obtained. The more preferable mode for improving the durability is the one shown in FIG. 5, wherein the entire piezoelectric/electrostrictive device is covered with the coating films.

Particularly, when the coating films are made of polysilazane, since, as described later, polysilazane chemically changes into a silica ($SiO_2$) film while consuming moisture, the moisture in the high humidity atmosphere, as well as moisture existing in the piezoelectric/electrostrictive elements or the piezoelectric/electrostrictive device, is removed. Accordingly, the inside of the coating films is always in a dry state so that it becomes more difficult to induce deterioration.

The fourth effect is to prevent adhesive failure of components etc. In the piezoelectric/electrostrictive device according to the present invention, the adhesive property of the surfaces (side surfaces and end surfaces) of the piezoelectric/electrostrictive device can be improved by covering the whole piezoelectric/electrostrictive device with the coating films as shown in FIG. 5.

For example, when using the piezoelectric/electrostrictive device according to the present invention for positioning the hard disk magnetic head as described above, the magnetic head is joined to the end surfaces of the movable portions as shown in FIG. 2, or the piezoelectric/electrostrictive device itself is joined to the hard disk suspension or the like. On the other hand, conventionally, since the adhesion property of the surfaces of the piezoelectric/electrostrictive device is not good, sufficient adhesive strength can not be obtained.

The reason why the adhesive property of the surfaces of the piezoelectric/electrostrictive device is not good is considered as follows: Upon processing a piezoelectric/electrostrictive device into a required shape, the processing such as wire sawing or dicing is carried out. Since the piezoelectric/electrostrictive device is very small (e.g. about 1 to 2 mm between the thin plate portions, about 0.05 to 0.5 mm in thickness (width of end surface)), it is difficult to completely remove chips or abrasive grains adhered to the processing surfaces so that the joining is performed via those residual chips or abrasive grains.

When the piezoelectric/electrostrictive device according to the present invention is used, inasmuch as the coating films are formed after the processing, no such a problem is raised. A resin film is inferior in adhesive property and thus is not preferable. An inorganic film is preferable for the coating film, which is preferably made of the aforementioned low thermal expansion coefficient material like $Mo_2O_3$, $Nb_2O_5$, $U_3O_8$, $PbTiO_3$, $SrZrO_3$, $SiO_2$, $SiO_2$ added with a trace amount of $TiO_2$, or cordierite.

Hereinbelow, an embodiment of the piezoelectric/electrostrictive element according to the present invention will be described with an application example given.

The piezoelectric/electrostrictive element according to the present invention is a filmy piezoelectric/electrostrictive element having an piezoelectric/electrostrictive layer and a pair of electrodes formed on the piezoelectric/electrostrictive layer, wherein at least a pair of side surfaces parallel to the displacing direction are covered with coating films. Each of the coating films is a film formed of polysilazane, or a film formed of substantially $SiO_2$ only and having a thickness of 0.1 $\mu$m or greater.

Irrespective of whether each of the coating films covering at least the pair of side surfaces parallel to the displacing direction is the film formed of polysilazane, or the film formed of substantially $SiO_2$ only and having the thickness of 0.1 $\mu$m or greater, it is a film having a lower thermal expansion coefficient than a piezoelectric/electrostrictive material forming the piezoelectric/electrostrictive element, so that the piezoelectric/electrostrictive element according to the present invention can be preferably applied to the piezoelectric/electrostrictive device according to the present invention that has been already described.

Figure 12:
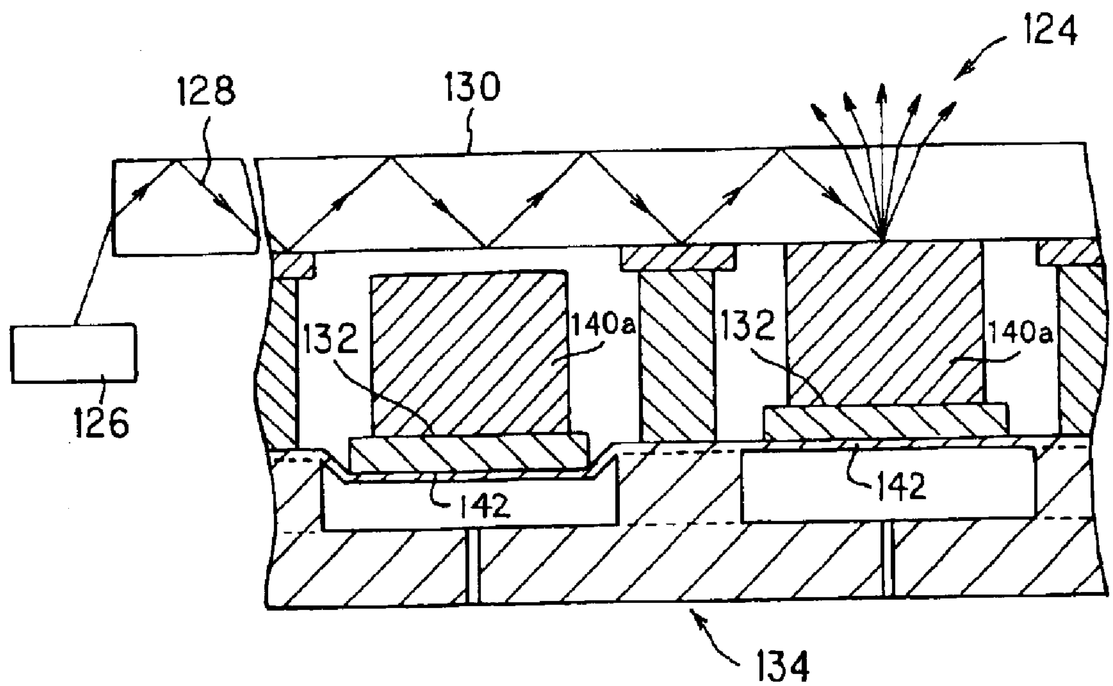
FIG. 12 is a sectional view showing an application example of a piezoelectric/electrostrictive element according to the present invention.

FIG. 12 is a sectional view of a display element for a display device being another application example of the piezoelectric/electrostrictive element according to the present invention. A display element 124 comprises an optical waveguide plate 130 into which light 128 from a light source 126 is introduced, and a driving portion 134 provided so as to confront the back of the optical waveguide plate 130 and having many actuator portions 132 arranged in a matrix or zigzag fashion correspondingly to pixels.

Although a pixel array configuration is not shown, for example, two actuator portions 132 arrayed vertically form one dot, and three dots (red dot, green dot, and blue dot) are arrayed horizontally to form one pixel. In the display element 124, pixel forming members 140*a* are stacked in layers on each actuator portion 132, and the pixel forming members 140*a* are displaced upward and downward (in the figure) following displacement of each actuator portion 132 to increase a contact area with the optical waveguide plate 130, thereby to achieve the area corresponding to a pixel so as to express a color image.

Normally, in case of such a display element for the display device, when operation is started, it continues over a long term, and the temperature, humidity, and so on of ambient environment where it is used are not necessarily good conditions. Therefore, higher durability is required for the respective components. The piezoelectric/electrostrictive element according to the present invention is provided with, among the aforementioned first to fourth effects of the piezoelectric/electrostrictive device according to the present invention, the second and third effects relating to the piezoelectric/electrostrictive element. In other words, it is a displacement control element that is resistant to occurrence of particles and excellent in durability, and thus is suitable as the actuator portion 132 of the display element 124. Particularly, when a coating film covering the actuator portion 132 and a thin plate portion 142 is made of polysilazane, the inside of the coating film is always in a dry state so that it is possible to fully avoid adverse influence caused by the ambient high humidity, or deterioration caused by internally existing moisture.

Now, the materials for forming the piezoelectric/electrostrictive device and the piezoelectric/electrostrictive element according to the present invention will be described.

As a material forming the movable portions and the fixing portion of the piezoelectric/electrostrictive device, there is no particular limitation as long as it has rigidity. On the other hand, ceramics to which the later-described ceramic green sheet stacking method is applicable can be preferably used. Specifically, there can be cited those materials each containing, as a main component, zirconia such as stabilized zirconia or partially stabilized zirconia, alumina, magnesia, silicon nitride, aluminum nitride, or titanium oxide, and further, those materials each containing a mixture thereof as a main component. However, in view of high mechanical strength or toughness, the material containing zirconia, particularly, stabilized zirconia or partially stabilized zirconia, as the main component is preferable. With respect to metal materials, there is no limitation as long as they have rigidity. However, there can be cited stainless steel, nickel, spring steel, brass, beryllium copper, and so on.

As a material forming the thin plate portions, the same ceramics for the movable portions and the fixing portion can be preferably used. Among them, zirconia, particularly a material containing stabilized zirconia as a major component and a material containing partially stabilized zirconia as a major component are preferably usable because the mechanical strength is large and the toughness is high even in case of a small thickness, and reactivity with the piezoelectric/electrostrictive layers and the electrode material is small. When forming the thin plate portions with a metal material, it is sufficient that the metal material has flexibility and is bendable to deform. However, as ferrous materials, various stainless steel products and various spring steel products are preferable, while, as non-ferrous materials, brass, beryllium copper, phosphor bronze, nickel, and a nickel-iron alloy are preferable.

In the piezoelectric/electrostrictive element, piezoelectric ceramics are preferably used for the piezoelectric/electrostrictive layers, but it is also possible to use electrostrictive ceramics, ferroelectric ceramics, or antiferroelectric ceramics. As concrete materials, there can be cited those ceramics each containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, bismuth neodymium titanate, potassium sodium niobate, strontium bismuth tantalate, or the like alone or as a mixture thereof.

It is preferable that the electrode of the piezoelectric/electrostrictive element is made of a metal that is a solid body at room temperature will excellent conductivity. For example, aluminum, titanium, chrome, iron, cobalt, nickel, copper, zinc, niobium, molybdenum, ruthenium, palladium, rhodium, silver, tin, tantalum, tungsten, iridium, platinum, gold, or lead are used alone or as an alloy thereof. Further, a cermet material obtained by dispersing the same material as that of the piezoelectric/electrostrictive layer or the thin plate portion into such metals may also be used.

Now, the first production method including a process of applying the coating films of the piezoelectric/electrostrictive device according to the present invention will be described with reference to the figures. Description about a production method of the piezoelectric/electrostrictive element according to the present invention will also be included herein.

In the piezoelectric/electrostrictive device according to the present invention, constituent materials of the respective members are ceramics, and it is preferable to produce the base body excluding the piezoelectric/electrostrictive elements, i.e. the thin plate portions, the fixing portion, and the movable portions, using the ceramic green sheet stacking method described hereinbelow. The reason therefor is that there occurs substantially no time-domain change in state at joined portions of the respective members so that reliability of the joined portions is high, and there is an advantage in ensuring rigidity. On the other hand, with respect to the piezoelectric/electrostrictive elements, electrode terminals, and the like, it is preferable to produce them using the thin or thick film formation method. The production methods based on these means are excellent in productivity and formability and can obtain the piezoelectric/electrostrictive devices with high reproducibility in a short time.

First, the ceramic green sheet stacking method will be described. A binder, a solvent, a dispersing agent, a plasticizer, etc. are added to ceramic powder such as zirconia powder, which are mixed to produce slurry. After degassing the slurry, a ceramic green sheet having a predetermined thickness is produced by the reverse roll coater method, the doctor blade method, etc. Then, using the method such as the punching processing using dies or the laser processing, the ceramic green sheet is processed into a predetermined shape to obtain a plurality of ceramic green sheets for forming a base body. Thereafter, the ceramic green sheets are stacked and press-joined to be formed into a ceramic green stacked body, which is then fired to obtain a ceramic stacked body.

The piezoelectric/electrostrictive elements are formed on both surfaces of the ceramic stacked body without using a joining agent by using, for example, a thick film formation method such as a screen printing method, a dipping method, a coating method or an electrophoretic method, or by a thin film formation method such as an ion beam method, a sputtering method, a vacuum evaporation method, an ion plating method, a chemical vapor deposition (CVD) method or a plating method. Thick film formation method are preferred.

Details about the process for preparing the base body, forming the piezoelectric/electrostrictive elements, and making up the shape of the piezoelectric/electrostrictive device follow the description of JP-A-2001-320103. As described therein, a plurality of production processes are implemented.

Subsequently, at least both side surfaces of the thin plate portions and the piezoelectric/electrostrictive elements are covered with coating films made of a material with a low thermal expansion coefficient using the film formation method. It is also preferable to cover the whole side surfaces of the piezoelectric/electrostrictive device including the movable portions and the fixing portion in addition to the thin plate portions and the piezoelectric/electrostrictive elements, with the coating films of the low thermal expansion coefficient material. Further, it may also be arranged that the whole piezoelectric/electrostrictive device including the end surfaces is covered with the coating films of the low thermal expansion coefficient material. Herein, both side surfaces of the piezoelectric/electrostrictive elements represent such surfaces that are parallel to the displacing direction.

There is no limitation about the low thermal expansion coefficient material to be used as long as it has a thermal expansion coefficient lower than that of a piezoelectric/electrostrictive material forming the piezoelectric/electrostrictive elements. For example, $Mo_2O_3$, $Nb_2O_5$, $U_3O_8$, $PbTiO_3$, $SrZrO_3$, $SiO_2$, $SiO_2$ added with a trace amount of $TiO_2$, or cordierite may be used. Among them, it is preferable to form the coating film of substantially silica ($SiO_2$) only.

As the film formation method used in the formation of the coating film, means such as sticking a separately prepared filmy plate, coating, dipping, sputtering, CVD, or laser ablation can be adopted. Taking into consideration the low thermal expansion coefficient material to be used, and the portion and area where the coating film is formed, a suitable method that is easy to apply may be used.

Figure 6A:
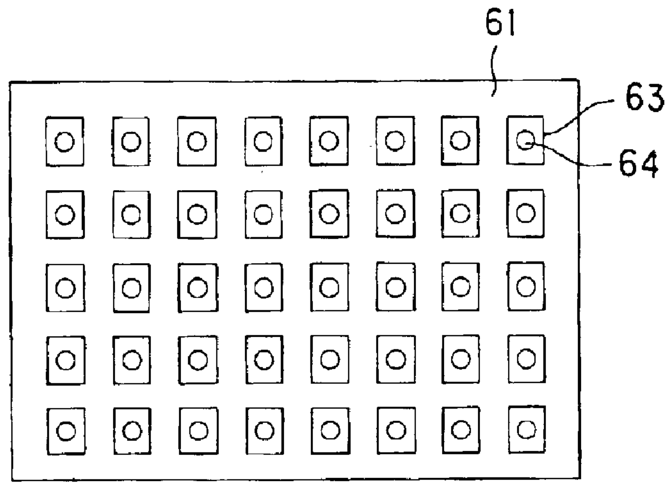
FIGS. 6(*a*), (*b*) and (*c*) are plan views showing a step by step embodiment of a first production method for forming a piezoelectric/electrostrictive device according to the present invention.
Figure 6B:
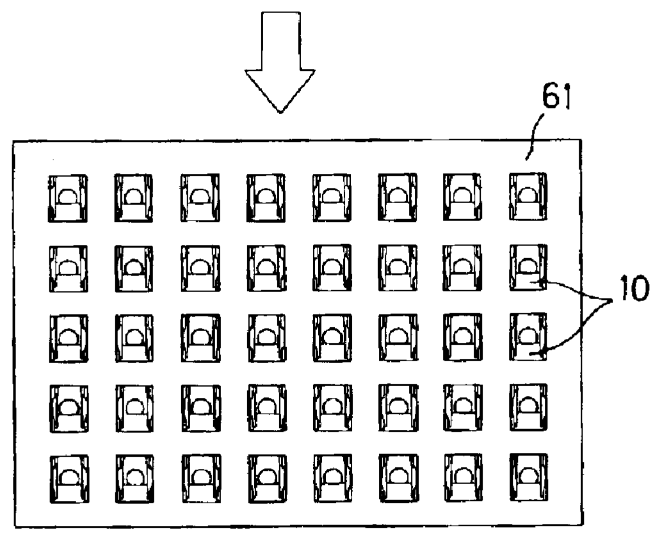
Figure 6C:
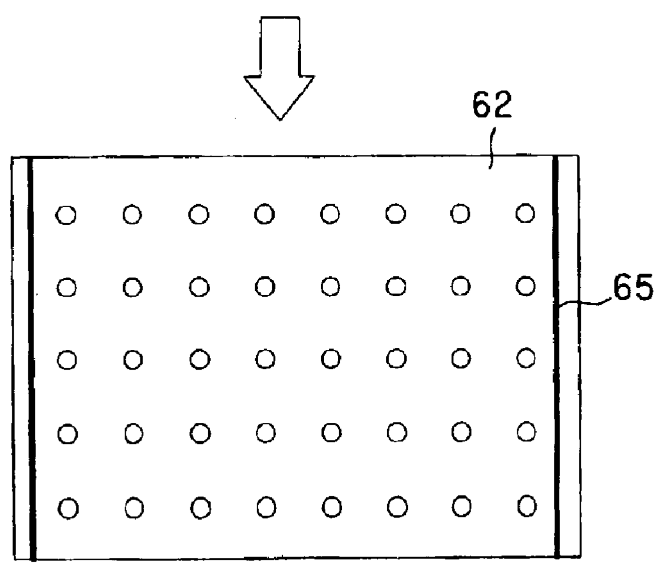

FIGS. 6(*a*) and (*c*) are plan views for explaining processes of forming the coating films using the dipping method, wherein the whole of the piezoelectric/electro-strictive device 10 (see FIG. 3) is covered with the coating films of the low thermal expansion coefficient material to produce the piezoelectric/electrostrictive 150 (see FIG. 5). Here, the coating films are formed of silica ($SiO_2$).

First, a thick plate 61 (e.g. made of PTFE) having many small dipping baths for dipping therein piezoelectric/electrostrictive devices 10, is prepared. The thick plate 61 is formed with many cavities 63 each having a liquid draining hole 64 and having a shape that agrees with a shape of the piezoelectric/electrostrictive device 10, and each cavity 63 serves as a dipping bath. Then, the piezoelectric/electrostrictive devices 10 are placed in the cavities 63, and a thick plate 62 having the same shape as the thick plate 61 is reversed to cover the thick plate 61. Then, the thick plate 61 and the thick plate 62 are fixed together using rubber bands 65 having solvent resistance, or the like, so as to prevent the thick plate 62 from being detached from the thick plate 61.

Then, the thick plates 61 and 62 with the piezoelectric/electrostrictive devices 10 accommodated therein are dipped into a polysilazane solution that has been diluted to, for example, 20 mass % by xylene. After taking out the piezoelectric/electrostrictive devices 10 from the polysilazane solution, the excessive solution is removed by, for example, blowing nitrogen gas to dry them, and further, xylene is removed by heating to dry them, for example, at 120° C. for 30 minutes. Thereafter, a heat treatment is applied to them, for example, at 450° C. for about 2 hours.

Through the aforementioned processes, films of polysilazane adhered to all the surfaces of each piezoelectric/electrostrictive device 10 by dipping are converted into ceramic fine coating films made of substantially silica only due to oxidation or hydrolysis, so that the piezoelectric/electrostrictive device 150 covered with the coating films entirely as shown in FIG. 5 can be obtained.

Polysilazane (—$SiH_2NH$—) has a width in average molecular weight over a range of about 300 to 5000. There also exists polysilazane containing an oxidation catalyst or a dehydrogenation agent. Any of such polysilazanes will do when used for forming the coating films on the piezoelectric/electrostrictive device or the piezoelectric/electrostrictive element according to the present invention. However, since it is possible that viscosity changes depending on molecular weight, it is preferable to use polysilazane through dilution to a suitable concentration, not limited to the aforementioned example, by xylene or the like for controlling the thickness of films adhered to the device by dipping to, preferably 0.1 $\mu$m or greater. Further, it is preferable to properly change the aforementioned heating/drying time, heat treatment temperature, and required time therefor depending on the kind of polysilazane.

Figure 8A:
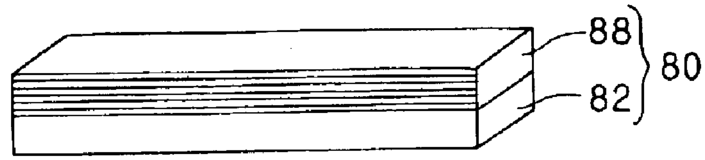
FIGS. 8(*a*) and (*b*) are perspective views showing another embodiment of the first production method according to the present invention.
Figure 8B:
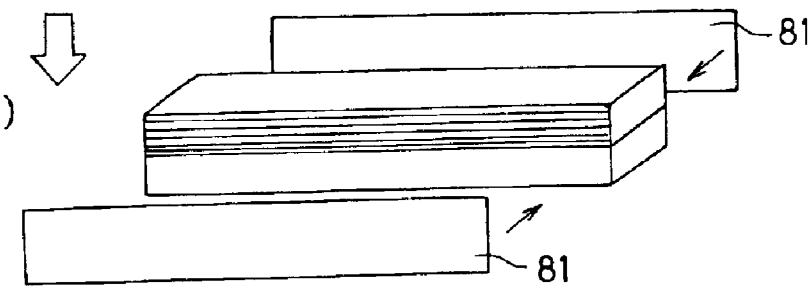
Figure 9A:
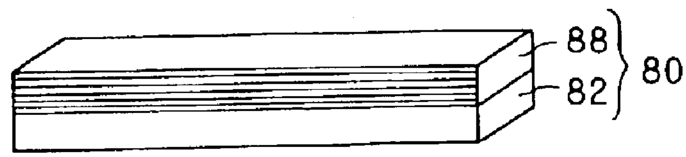
FIGS. 9(*a*) and (*b*) are perspective views showing still another embodiment of the first production method according to the present invention.
Figure 9B:
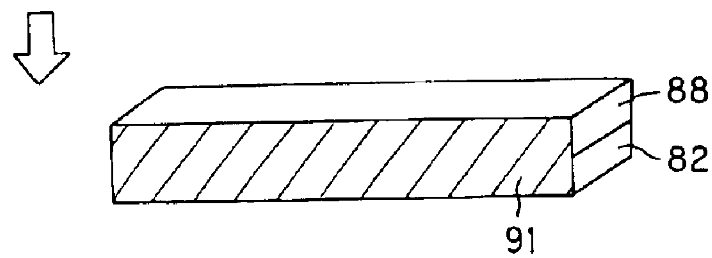
Figure 10A:
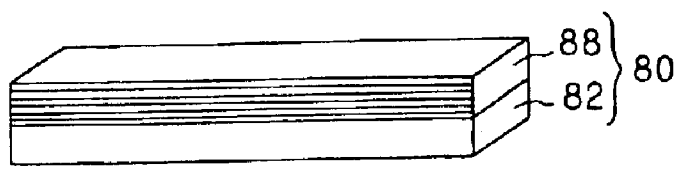
FIGS. 10(*a*) and (*b*) are perspective views showing still another embodiment of the first production method according to the present invention.
Figure 10B:
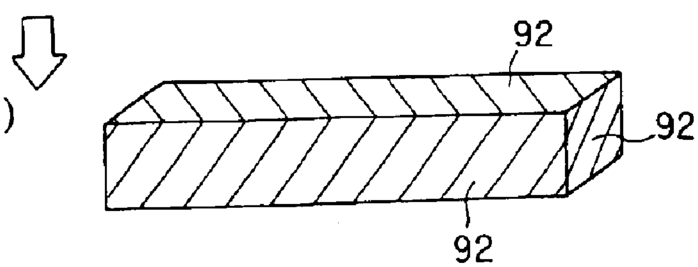
Figure 11:
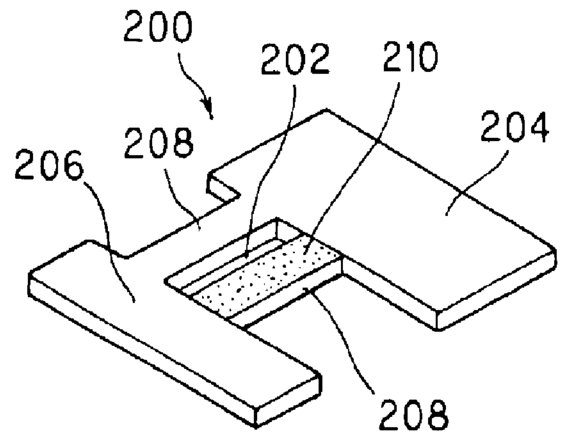
FIG. 11 is a perspective view showing an example of a conventional piezoelectric actuator.

FIGS. 8 to 10 are perspective views for explaining processes of forming coating films of a low thermal expansion coefficient material relative to a piezoelectric/electrostrictive device 80 of a unimorph type having a vibration plate 82 made of zirconia, and a piezoelectric/electrostrictive element 88 of a stacked type formed thereon.

FIGS. 8(*a*) and (*b*) show the state wherein separately prepared filmy plates 81 of a low thermal expansion coefficient material are stuck to side surfaces of the piezoelectric/electrostrictive device 80. This method is applicable to a piezoelectric/electrostrictive device of a relatively large size. For each filmy plate 81, various kinds of glass having silica as a main component (e.g. soda glass) can be used. The sticking may be implemented using an epoxy, urethane, or acrylic adhesive agent, or the like.

With respect to a piezoelectric/electrostrictive device of a relatively small size, it is preferable to form coating films directly on side surfaces of a piezoelectric/electrostrictive device 80 using a low thermal expansion coefficient material as shown in FIGS. 9(*a*) and (*b*) and FIGS. 10(*a*) and (*b*). FIGS. 9(*a*) and (*b*) show the state wherein a coating film 91 having a thickness of 0.1 to 10 $\mu$m is formed selectively on a side surface of the piezoelectric/electrostrictive device 80 using, for example, $SiO_2$ added with a trace amount of $TiO_2$ through sputtering.

On the other hand, FIGS. 10(*a*) and (*b*) show the state wherein coating films 92 having a thickness of 0.1 to 10 $\mu$m are formed on all the surfaces of the piezoelectric/electrostrictive device 80 using, for example, a siloxane solution according to the coating method. The siloxane solution is converted into a silica film through the sol-gel reaction. Even by the aforementioned other means using polysilazane, it is possible to form coating films composed of substantially silica only.

Now, the second to fourth production methods of the piezoelectric/electrostrictive device according to the present invention, i.e. embodiments of the production methods including a diffusion joining process, will be described. Although a thin plate or a thick plate in the form of a metal plate having a window portion is used in the following embodiments, a thin plate or a thick plate having no window portions may also be used as described before.

Figures 21A, 21B, 21C, 21D, 21E, 21F, 21G:
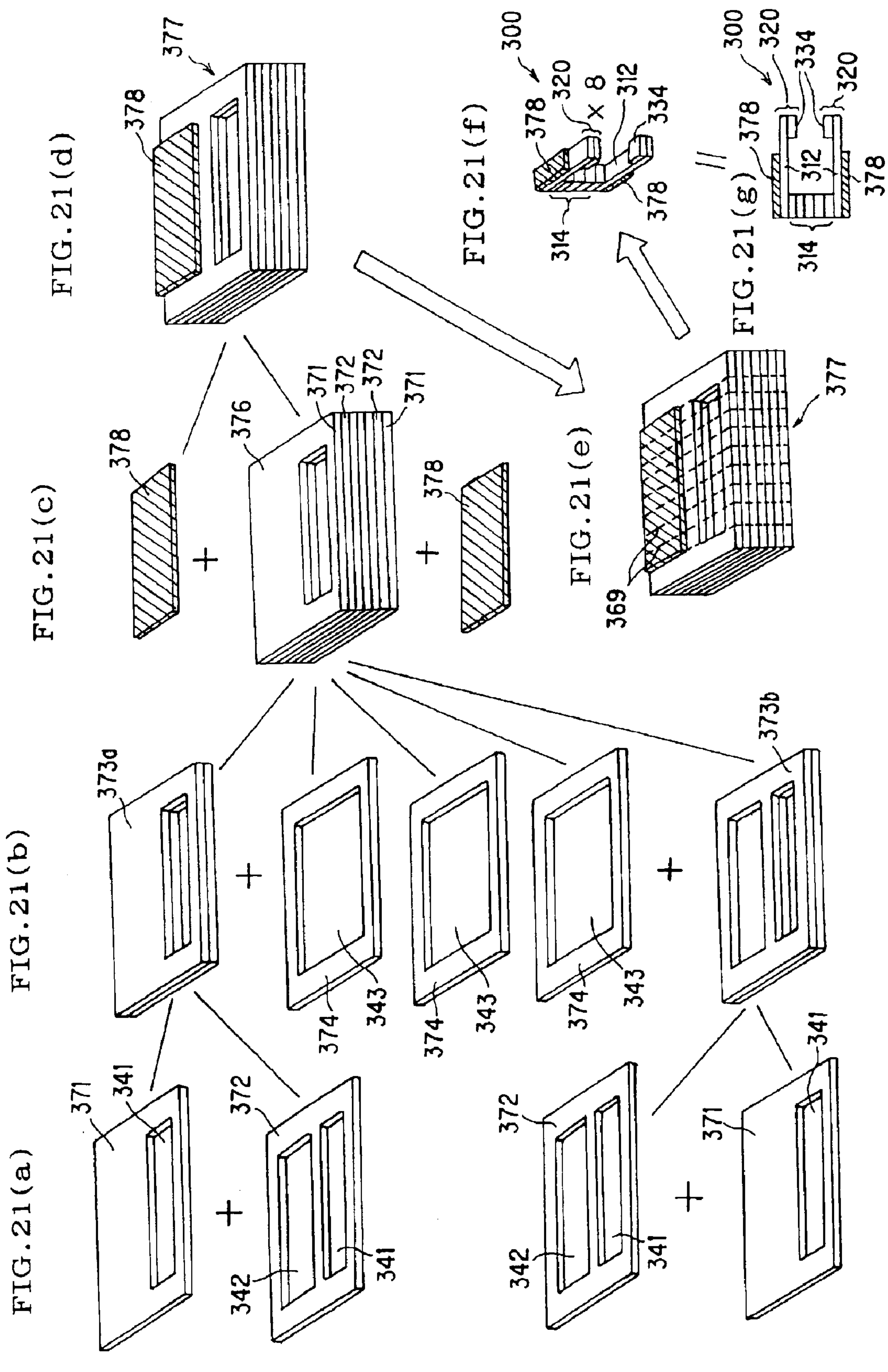
FIGS. 21(*a*)–(*g*) are perspective views showing another embodiment of the fourth production method according to the present invention, wherein FIGS. 21(*a*) to 21(*e*) are diagrams for explaining the production processes, FIG. 21(*f*) is a perspective view of a produced piezoelectric/electrostrictive device, and FIG. 21(*g*) is a side view of the produced piezoelectric/electrostrictive device.
Figure 22:
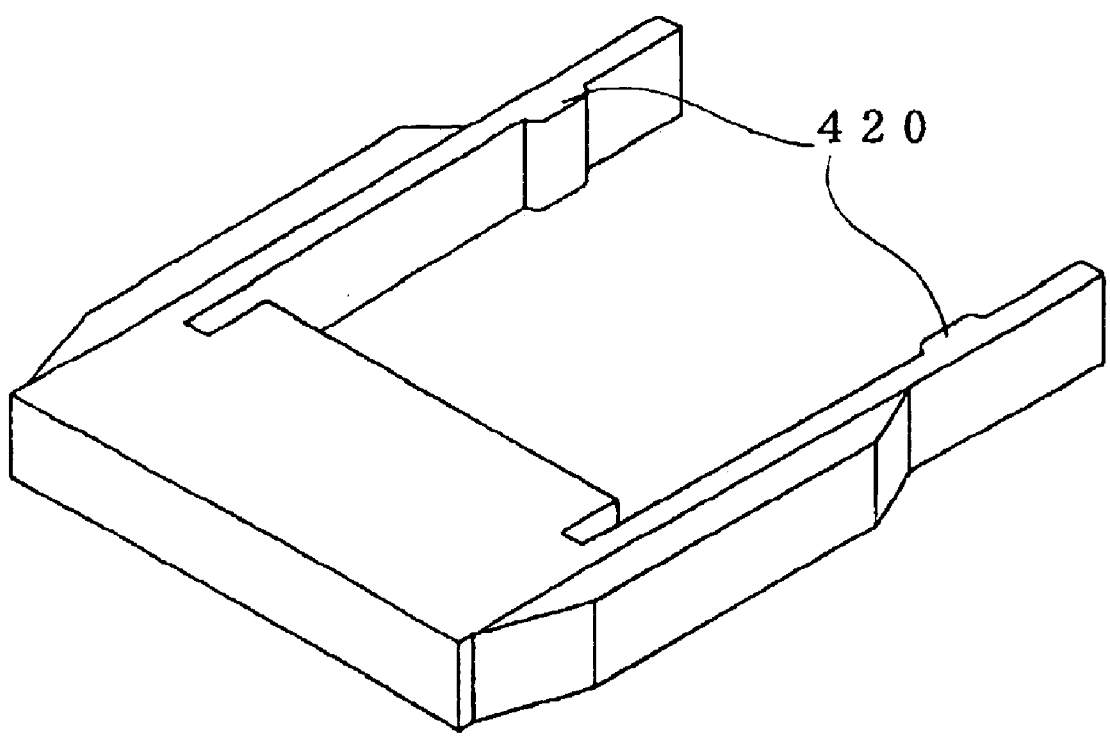
FIG. 22 is a perspective view showing still another embodiment of a piezoelectric/electrostrictive device according to the present invention.

First, the fourth production method of the piezoelectric/electrostrictive device according to the present invention will be described with reference to FIGS. 21(*a*) to 21(*g*). FIGS. 21(*a*) to 21(*e*) are diagrams for explaining one example of processes of the fourth production method of the piezoelectric/electrostrictive device according to the present invention, FIG. 21(*f*) is a perspective view showing one example of the piezoelectric/electrostrictive device to be produced, and FIG. 21(*g*) is a side view thereof. A piezoelectric/electrostrictive device 300 shown in FIGS. 21(*f*) and 21(*g*) comprises a pair of mutually confronting thin plate portions 312 and a fixing portion 314 supporting the pair of thin plate portions 312, wherein movable portions 320 are provided at tip end portions of the pair of thin plate portions 312, the movable portions 312 have mutually confronting end surfaces 334, and a piezoelectric/electrostrictive element 378 is provided on each of the thin plate portions 312.

The production processes will be described. First, as shown in FIG. 21(*a*), a thin plate 371 that becomes thin plate portions 312 later, and one thin plate 372 (two or more may be provided) that has a window portion 341 and becomes movable portions 320 and parts of fixing portions 314 later, are preliminarily joined with the thin plate 371 placed on an upper side to form a preliminary stacked body, then joined together by diffusion joining to prepare an intermediate joined body 373*a* (see FIG. 21(*b*)). Similarly, a thin plate 371 and a thin plate 372 are preliminarily joined with the thin plate 372 placed on an upper side to form a preliminary stacked body, then joined together by diffusion joining to prepare an intermediate joined body 373*b* (see FIG. 21(*b*)). The thin plates 371, the thin plates 372, and thin plates 374 referred to hereinbelow are metal plates of, for example, 18Cr-8Mo, and have thicknesses of, for example, 60 μm (thin plate 371), 70 μm (thin plate 372), and 150 μm (thin plate 374). The diffusion joining method for joining the thin plates by diffusion joining after the formation of the preliminary stacked body will be described in detail later.

Then, as shown in FIG. 21(*b*), three thin plates 374 (there is no limitation in number if it is no less than one) that each have a window portion 343 and that become the fixing portions later, are sandwiched between the intermediate joined body 373*a* and the intermediate joined body 373*b*, and the intermediate joined body 373*a*, the intermediate joined body 373*b*, and the thin plates 374 are preliminarily joined to form a preliminary stacked body, then joined together by diffusion joining to prepare a joined body 376 (see FIG. 21(*c*)).

Subsequently, as shown in FIG. 21(*c*), separately prepared piezoelectric/electrostrictive elements 378 are disposed by adhesion on both outer surfaces of the joined body 376, i.e. on the thin plates 371 located at the lowermost layer and the uppermost layer, at positions corresponding to window portions 342 of the thin plates 372, thereby to prepare an original piezoelectric/electrostrictive device 377 (see FIG. 21(*d*)). Then, as shown in FIG. 21(*e*), the original piezoelectric/electrostrictive device 377 is cut along cutting lines 369 so that eight individual piezoelectric/electrostrictive devices 300 described above can be obtained.

The third production method of a piezoelectric/electrostrictive device according to the present invention follows the aforementioned fourth production method of the piezoelectric/electrostrictive device according to the present invention. Specifically, the third production method of the piezoelectric/electrostrictive device according to the present invention is a production method of a piezoelectric/electrostrictive device that comprises a pair of mutually confronting thin plate portions, and a fixing portion supporting the pair of thin plate portions, wherein one or more piezoelectric/electrostrictive elements are disposed on at least one of the pair of thin plate portions, and the movable portions 320 are removed from the piezoelectric/electrostrictive device 300 shown in FIGS. 21(*f*) and 21(*g*). The production processes follow the aforementioned processes shown in FIGS. 21(*a*) to 21(*e*) except that the thin plates 372 are not handled.

Referring now to FIGS. 13 to 16, another example of the fourth production method of a piezoelectric/electrostrictive device according to the present invention will be described. The aforementioned processes shown in FIGS. 21(*a*) to 21(*e*) are processes for obtaining eight piezoelectric/electrostrictive devices as an example. On the other hand, the following processes are processes for obtaining 160 piezoelectric/electrostrictive devices as an example. In the processes shown in FIGS. 21(*a*) to 21(*e*), a plurality of (eight) piezoelectric/electrostrictive devices are produced so as to be arrayed in one direction (lateral direction in the figure), while, in the processes shown in FIGS. 13 to 16, piezoelectric/electrostrictive devices are produced so as to be arrayed in two directions (in the figure, 20 in lateral direction and 8 rows in vertical direction; 20×8=160).

Figures 13A, 13B:
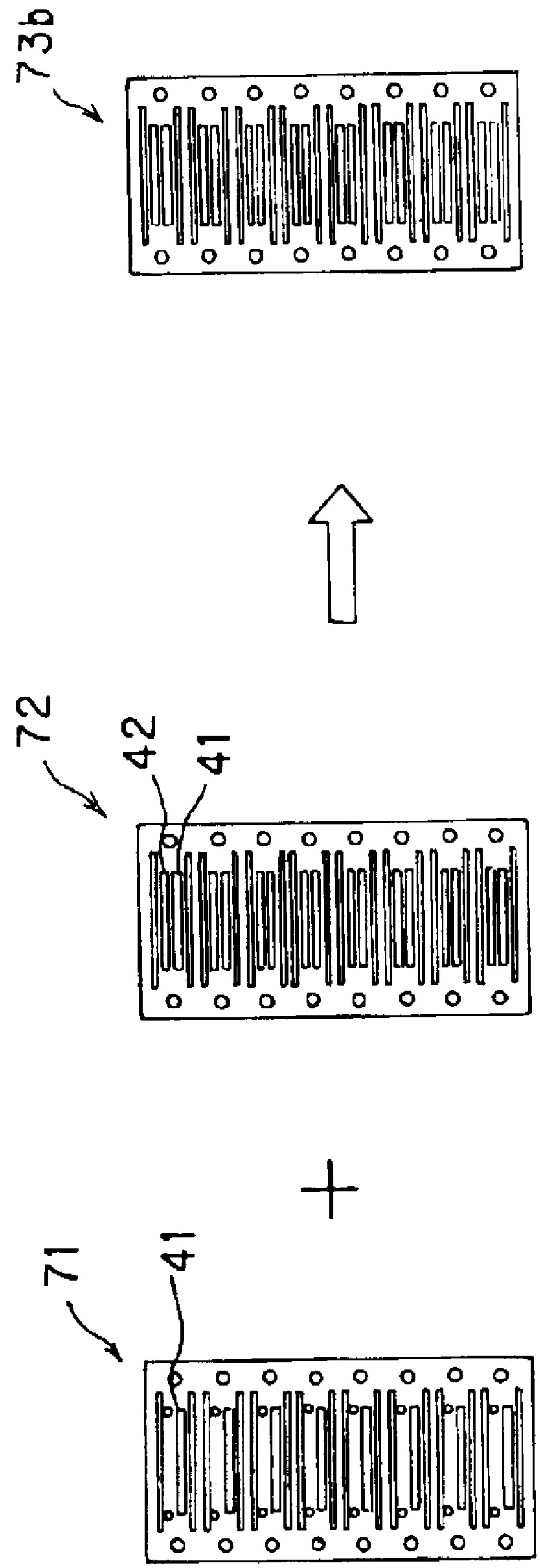
FIGS. 13(*a*) and (*b*) are plan views showing an embodiment of a fourth production method of making a piezoelectric/electrostrictive device according to the present invention, which is a diagram for explaining a portion of the production processes.

First, two thin plates 71 and two thin plates 72 are prepared each obtained by processing, for example, a SUS304 thin plate by means of the punching method using dies, or the chemical etching method. As shown in FIG. 13(*a*), each thin plate 71 is a metal plate that has window portions 41 in predetermined positions, has a predetermined shape with a thickness of, for example, 40 μm, and becomes thin plate portions later. Each thin plate 72 is a metal plate that has a shape corresponding to the shape of the thin plate 71, has a thickness of, for example, 50 μm, has window portions 41 and window portions 42 in predetermined positions, and becomes movable portions and parts of fixing portions. Then, one of the thin plates 71 and one of the thin plates 72, and the other thin plate 71 and the other thin plate 72 are preliminarily joined at four corners thereof using an adhesive agent, thereby to prepare two preliminary stacked bodies 73*a* and 73*b*. The preliminary stacked body 73*a* has a stacked structure wherein the thin plate 71 is placed on an upper side, while the preliminary stacked body 73*b* has a stacked structure wherein the thin plate 72 is placed on an upper side (FIG. 13(*b*) shows the preliminary stacked body 73*b*). The predetermined positions of the thin plates designating the positions of the formation of the window portions represent positions corresponding to eight rows in the vertical direction like the windows 41 and 42 shown in FIGS. 13(*a*) and (*b*). Later-described window portions follow this.

Figure 17:
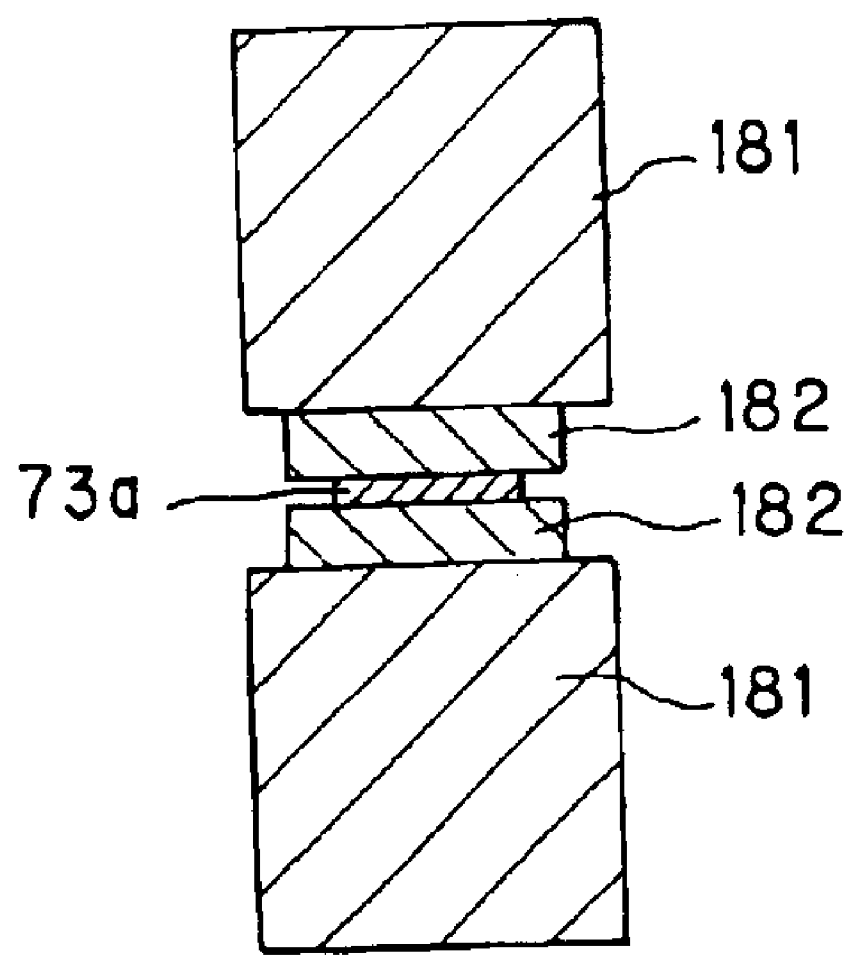
FIG. 17 is a side view showing the embodiment of the fourth production method of the piezoelectric/electrostrictive device according to the present invention, which is a diagram for explaining a diffusion joining method.

The obtained two preliminary stacked bodies 73*a* and 73*b* are formed into intermediate joined bodies 79*a* and 79*b* by joining the preliminarily joined thin plates 71 and 72 through diffusion joining. As shown in FIG. 17, the diffusion joining is carried out by placing, for example, the preliminary stacked body 73*a* between pressure dies 181 made of graphite, sandwiching pressure plates 182 made of MgO of 80% or more purity between the preliminary stacked body 73*a* and the pressure dies 181, and pressing the preliminary stacked body 73*a* by the pressure dies 181. The pressing condition is such that, for example, a pressing temperature is 850° C., a pressing time is 30 minutes, a pressing atmosphere is $2\times10^{-4}$ Torr, and a pressing pressure is 1.25 MPa. The diffusion joining method and the condition thereof described here are the same as those in the aforementioned and below-described diffusion joining processes.

Figures 14A, 14B:
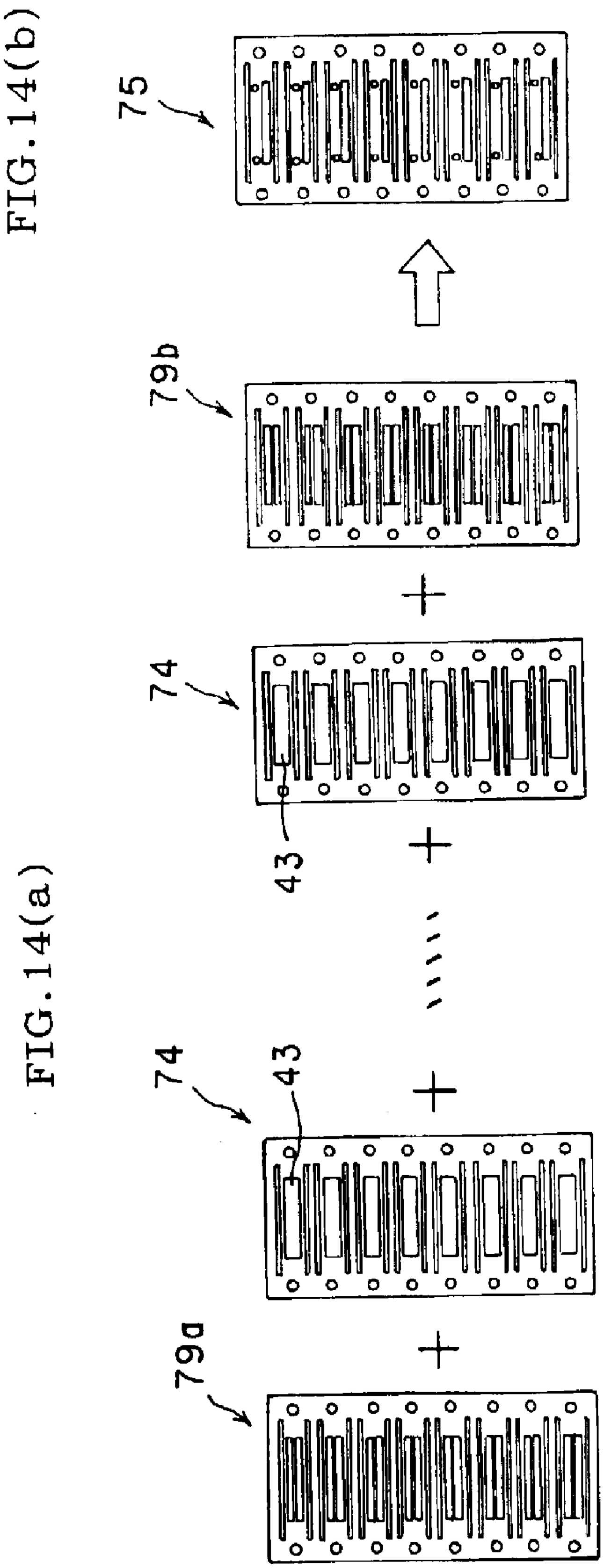
FIGS. 14(*a*) and (*b*) are plan views showing the embodiment of the fourth production method of the piezoelectric/electrostrictive device according to the present invention, which is a diagram for explaining a portion of the production processes.

Then, as shown in FIG. 14(*a*), a plurality of thin plates 74 are stacked, to a predetermined thickness, between the obtained two intermediate joined body 79*a* (upper side) and intermediate joined body 79*b* (lower side), and preliminarily joined at four corners thereof by an adhesive agent, thereby to prepare a preliminary stacked body 75, as shown in FIG. 14(*b*). In FIG. 14(*a*), each of the intermediate joined bodies 79*a* and 79*b* exposes the surface on the side of the thin plate 72 of the joined thin plates 71 and 72. Each thin plate 74 is a metal plate made of SUS304, which is the same as the thin plates 71 and 72, obtained through processing by means of the punching method using dies, or the chemical etching method, having a thickness of, for example, 200 μm, having a shape corresponding to the thin plates 71 and 72, and having the window portions 43 in predetermined positions. The thin plates 74 become the fixing portions later.

Figures 15A, 15B:
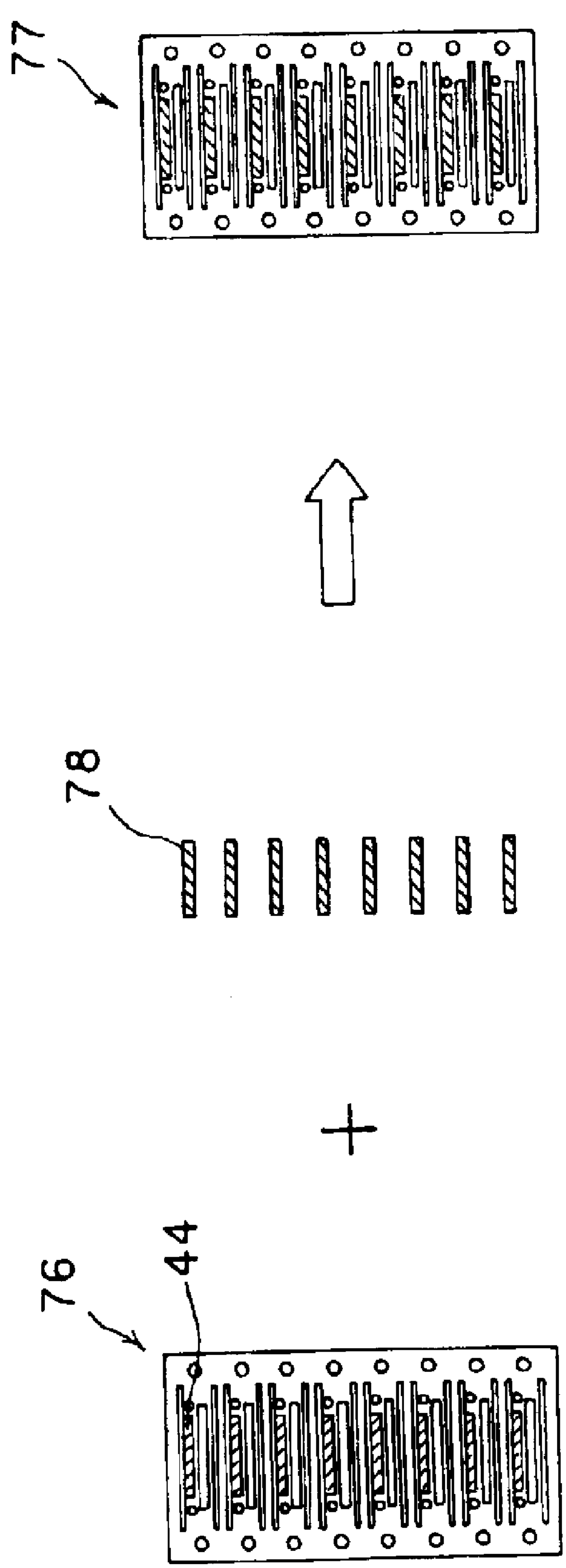
FIGS. 15(*a*) and (*b*) are plan views showing the embodiment of the fourth production method of the piezoelectric/electrostrictive device according to the present invention, which is a diagram for explaining a portion of the production processes.

The obtained preliminary stacked body 75 is formed into a joined body 76 by joining the preliminary joined intermediate joined bodies 79*a* and 79*b* and thin plates 74 through diffusion joining. Then, as shown in FIG. 15(*a*), predetermined positions of the obtained joined body 76 (portions located on the thin plate 71 and corresponding to positions of windows (openings) that exist at the window portions 42 of the thin plate 72, but do not exist at the window portions 41 of the thin plate 71) are set as adhesive agent applying portions 44, and an adhesive agent is applied thereto by the screen printing method, then separately prepared piezoelectric/electrostrictive elements 78 are placed on the adhesive agent applying portions 44, and the adhesive agent is cured to fix the piezoelectric/electrostrictive elements 78, thereby to obtain an original piezoelectric/electrostrictive device 77, as shown in FIG. 15 (*b*). Although not shown, the piezoelectric/electrostrictive elements 78 are also attached to the other of the thin plates 71 exposed at both surfaces of the joined body 76.

As the formation method of the piezoelectric/electrostrictive elements, there can be adopted, apart from the aforementioned method using the adhesion, a method of forming piezoelectric/electrostrictive elements directly on each thin plate 71 using the film formation technique such as the sol-gel method, sputtering, CVD, laser ablation, or plasma welding.

Figure 16:
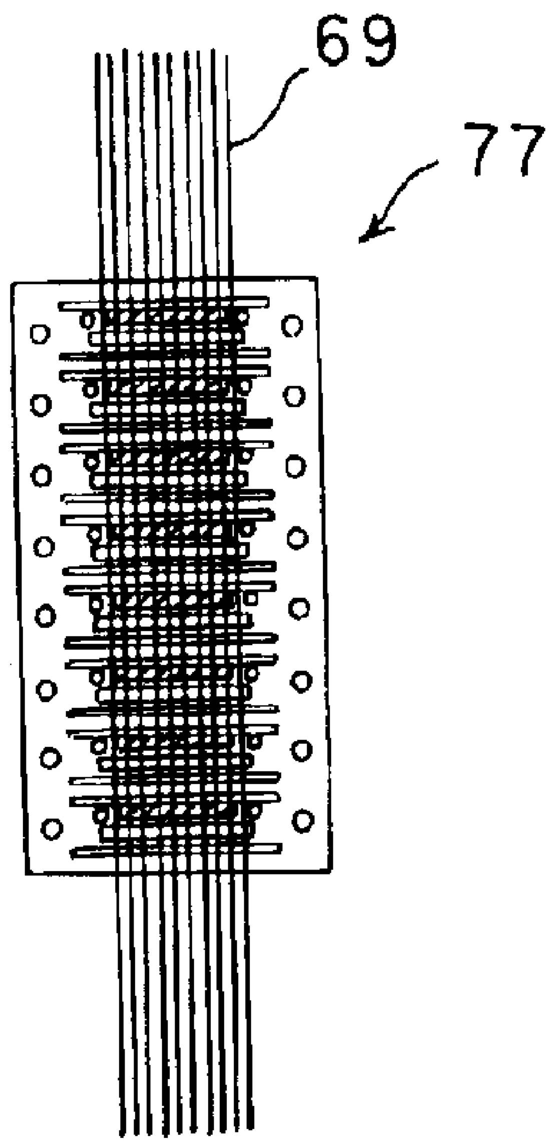
FIG. 16 is a plan view showing the embodiment of the fourth production method of the piezoelectric/electrostrictive device according to the present invention, which is a diagram for explaining a portion of the production processes.

Then, as shown in FIG. 16, the obtained original piezoelectric/electrostrictive device 77 is cut perpendicularly to a longitudinal direction of the window portions 41, 42 and 43 (lateral direction in the figure) along shown cutting lines 69, so that individual piezoelectric/electrostrictive devices can be obtained (although not clearly shown in the figure, there are 21 cutting lines 69 extending vertically in the figure, so that, by cutting, the original piezoelectric/electrostrictive device 77 is divided into 20 piezoelectric/electrostrictive devices per lateral row in the figure).

Figures 18A, 18B, 18C:
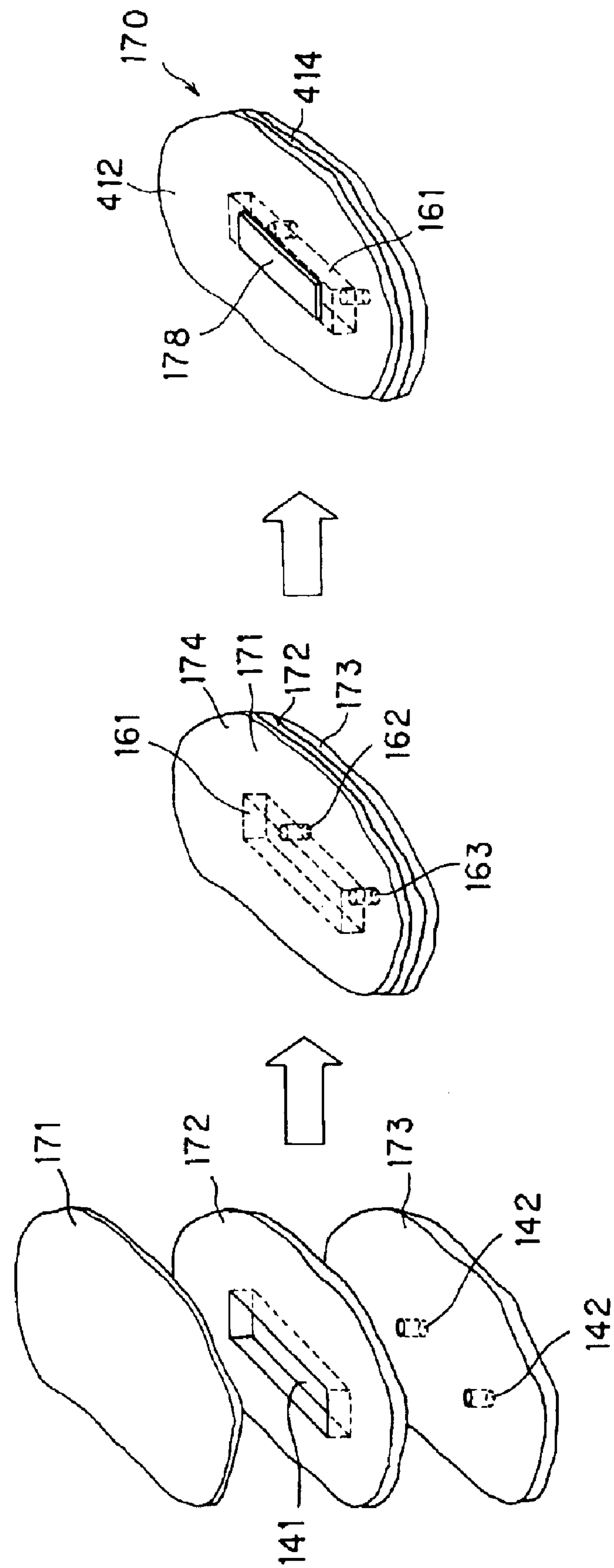
FIGS. 18(*a*), (*b*) and (*c*) are perspective views showing an embodiment of a second production method of making a piezoelectric/electrostrictive device according to the present invention, which is a diagram for explaining the production processes.
Figure 19:
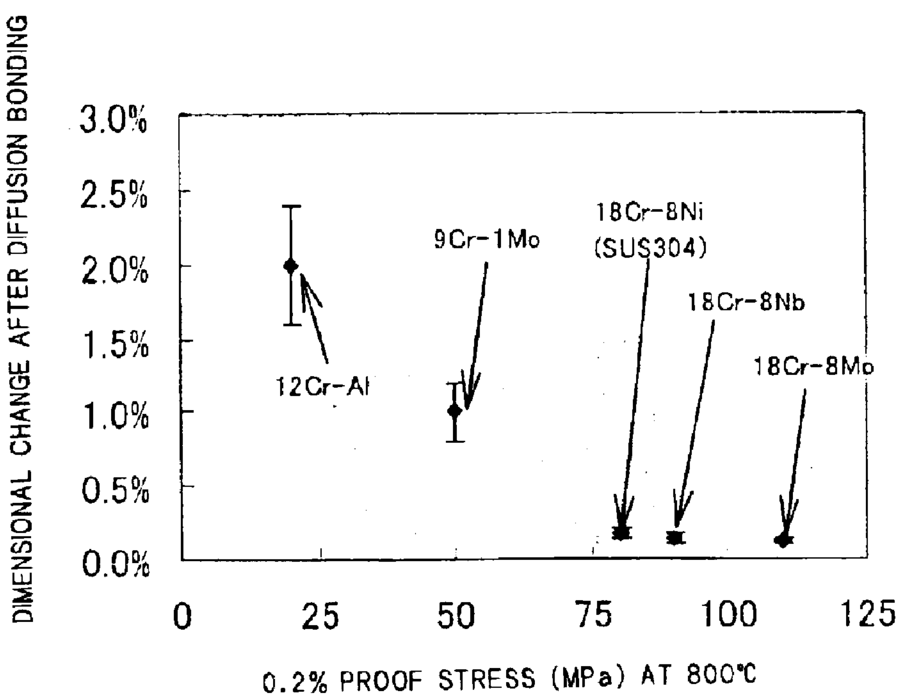
FIG. 19 is a graph showing a relationship between the 0.2% proof stress at 800° C. of a thin plate or a thick plate used in the second, third or fourth production method of the piezoelectric/electrostrictive device according to the present invention, and the dimensional change thereof before and after diffusion joining.
Figure 20:
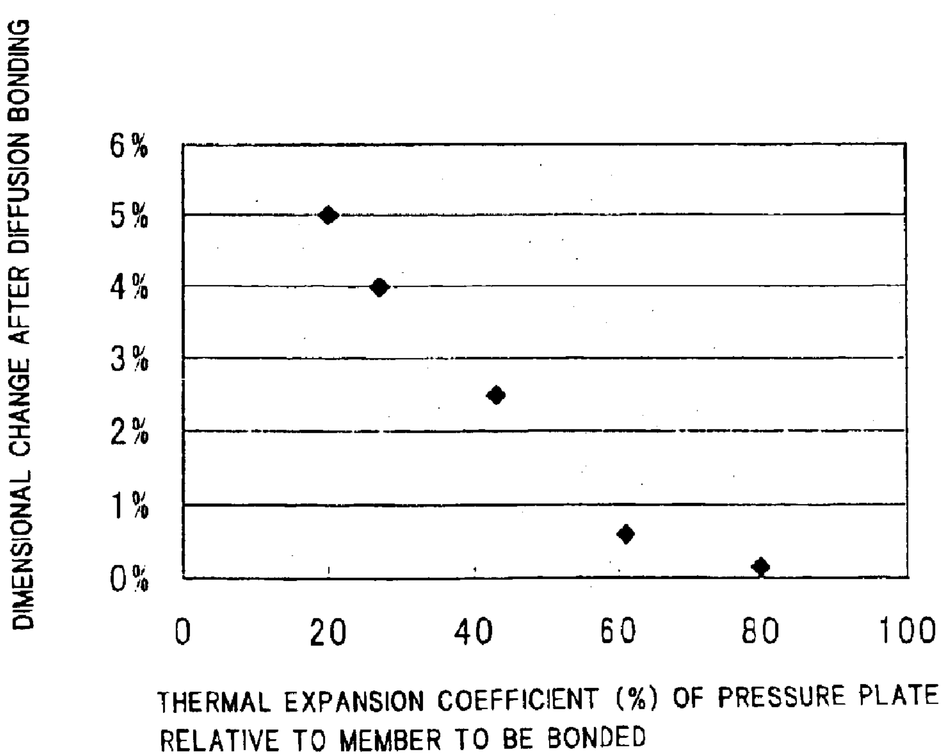
FIG. 20 is a graph showing a relationship between the ratio of thermal expansion coefficient of a ceramic pressure plate used in the second, third or fourth production method of the piezoelectric/electrostrictive device according to the present invention relative to thermal expansion coefficient of a member to be joined, and the dimensional change thereof before and after diffusion joining.

Now, a second production method for making the piezoelectric/electrostrictive device according to the present invention will be described. The second production method is a production method for making a piezoelectric/electrostrictive device that comprises a thin plate portion, and a fixing portion supporting the thin plate portion and formed with a cavity inside, wherein one or more piezoelectric/electrostrictive elements are disposed on the thin plate portion in a position corresponding to the cavity of the fixing portion. As one example of the piezoelectric/electrostrictive device, a droplet discharging device is cited and will be described based on production processes shown in FIGS. 18(*a*) to (*c*).

A droplet discharging device 170 comprises a thin plate portion 412, and a fixing portion 414 supporting the thin plate portion 412 and formed with a pressure chamber 161 (cavity) inside, wherein one piezoelectric/electrostrictive element 178 is disposed on the thin plate portion 412 in a position corresponding to the pressure chamber 161 of the fixing portion 414.

First, a thin plate 171 that becomes the thin plate portion 412 later, a thick plate 172 (at least a thin plate of one layer may be stacked) that has a window portion 141 of a predetermined shape and becomes the fixing portion 414 later, and a thick plate 173 formed with through holes 142 of a predetermined shape are prepared, then integrated through diffusion joining after preliminary adhesion, thereby to obtain a joined body 174. The window portion 141 serves as the pressure chamber 161 (cavity) for pressurizing droplets, and the through holes 142 serve as a liquid introducing port 162 for introducing a liquid into the pressure chamber, and a liquid discharging port 163 for discharging the liquid from the pressure chamber. Then, the piezoelectric/electrostrictive element 178 is fixed onto the thin plate 171 of the joined body 174 by an adhesive agent in a position corresponding to the window portion 141, so that the droplet discharging device 170 can be obtained.

In the aforementioned example, the description has been given about the droplet discharging device having only one cavity. However, in the diffusion joining method according to the present invention, since deformation of a member to be joined can be suppressed, even when producing a droplet discharging device having many cavities disposed, dispersion in discharge amounts between the respective cavities caused by position shift can be suppressed, so that the droplet discharging device can be suitably used.

EXAMPLE

Hereinbelow, the first and second piezoelectric/electrostrictive devices according to the present invention, i.e. the piezoelectric/electrostrictive devices having the coating films, will be described based on examples. However, the present invention is not limited to those examples.

First, a ceramic stacked body was obtained from ceramic powder containing zirconia as a main component by the ceramic green sheet stacking method. Then, on the surfaces of the ceramic stacked body, piezoelectric/electrostrictive elements were formed using lead zirconate titanate (piezoelectric/electrostrictive layers) and platinum (electrodes) by the screen printing method. Then, by making up the shape through the wire saw processing, 104 piezoelectric/electrostrictive devices each being the same as the piezoelectric/electrostrictive device 10 shown in FIG. 3 were obtained. Among them, 42 devices were used as samples B.

Then, 42 devices (corresponding to the samples B) of the obtained piezoelectric/electrostrictive devices were dipped in a polysilazane solution (N310 produced by Clariant International Ltd.) to form coating films, then were subjected to a heat treatment at 490° C. for 30 minutes, thereby to prepare 20 piezoelectric/electrostrictive devices with silica films formed on all the surfaces thereof. These were uses as samples A. The thickness of the silica film was 1 μm.

Similarly, 20 devices (corresponding to the samples B) of the obtained piezoelectric/electrostrictive devices were dipped in a fluorocarbon coating flux solution (obtained by diluting FC722 produced by Sumitomo 3M Co. Ltd. 50 times using a solvent PF5060 produced by Sumitomo 3M Co. Ltd.) to form coating films, then were heated to dry at 120° C. for 30 minutes, thereby to prepare 20 piezoelectric/electrostrictive devices with fluorocarbon coating films formed on all the surfaces thereof. These were uses as samples C. The thickness of the fluorocarbon coating film was 1 nm.

(Temperature Characteristic Test)

Figure 7:
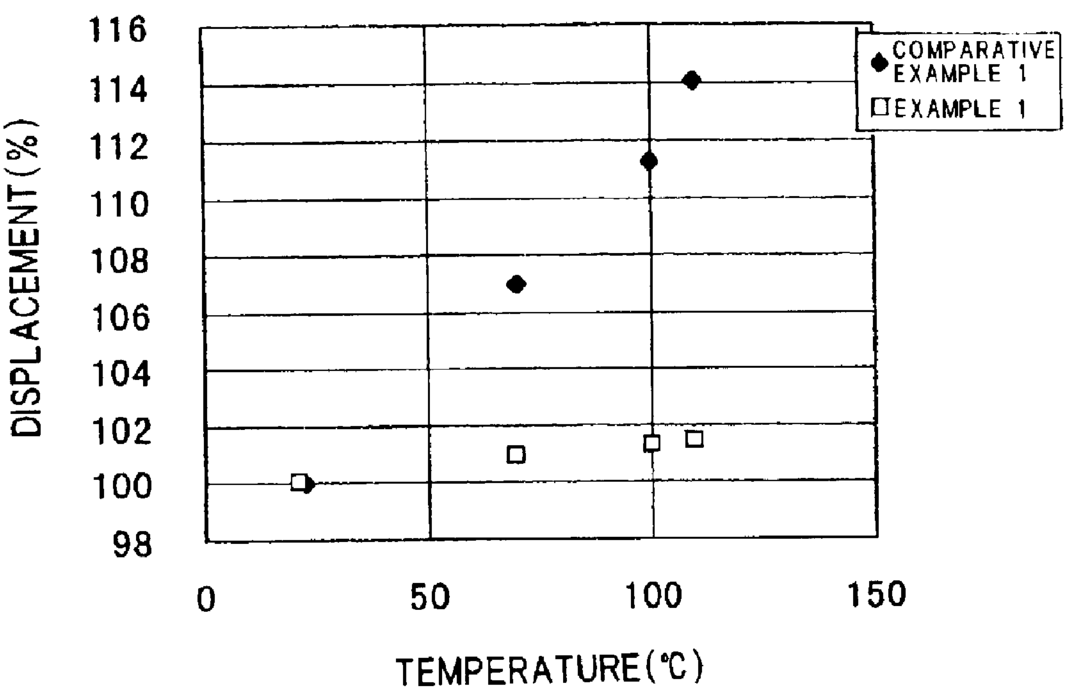
FIG. 7 is a graph showing a result of a temperature characteristic test in an example.

The sample A (one device) was placed on a hot plate and heated, then, by changing the temperature, displacement in response to an input at the respective temperatures was measured using a laser Doppler velocity meter (VL10 produced by Sony Corporation) (Example 1). The input was 30±30 V in the form of 1 kHz sin wave, and the temperature was changed to 25° C., 70° C., 100° C. and 110° C. The sample B was also tested in the same manner (Comparative Example 1). The result is shown in FIG. 7.

(Cleanliness Evaluation)

Pure water and the sample A (one device) were put into a fully washed container, and ultrasonic cleaning (frequency: 68 kHz) was performed for three minutes. Thereafter, the number of particles existing in the pure water in the container was measured using a particle counter (KL-26 produced by Rion Co., Ltd.). The result was several particles of 0.5 $\mu$m or greater per milliliter. The sample B was also tested in the same manner. The result was several hundred particles of 0.5 $\mu$m or greater per milliliter, and thus it was about 100 times the sample A.

(Durability Test 1)

A sealed container (length 260 mm×width 190 mm×height 90 mm) containing an ammonium sulfate saturated salt solution was put into a low temperature incubator (SLV-11 produced by Isuzu Co., Ltd.) set to 40° C., thereby to provide a constant-temperature constant-humidity environment (40° C., 85±5% R.H. (Relative Humidity)). Then, the samples A (20 devices) were put into the sealed container and operated continuously, thereby to examine durability thereof. The input was 30±30V in the form of 1 kHz sin wave. The samples B were also tested in the same manner. The result was that, in case of the samples B, five devices caused short circuit due to migration after a lapse of 100 hours, while, in case of the samples A, there was no occurrence of short circuit even after a lapse of 1000 hours.

(Durability Tests 2, 3 and 4)

By changing the solution, the temperature, and the humidity, the samples A (20 devices) and the samples B (20 devices) were tested in the same manner as in Durability Test 1 in constant-temperature constant-humidity environments like (Test 2) in case of a potassium bromide saturated salt solution at 20° C. and 84% R.H., (Test 3) in case of a sodium carbonate saturated salt solution at 25° C. and 87% R.H., and (Test 4) in case of a sodium bromide saturated salt solution at 40° C. and 55% R.H. In all the environments, the failure occurrence rates were lower in case of the samples A as compared with the samples B.

(Durability Test 5)

The samples A (20 devices) were operated continuously in environment at 85° C. and 85% R.H. (Relative Humidity) using a constant-temperature constant-humidity bath (PH-1K produced by Espec Corporation), thereby to examine durability thereof at high temperature and high humidity. The input was 30±30 V in the form of 1 kHz sin wave. The samples B were also tested in the same manner. The result was that, in case of the samples B, 12 devices caused short circuit due to migration after a lapse of 100 hours, while, in case of the samples A, only three devices caused short circuit even after a lapse of 500 hours.

(Durability Test 6)

The samples A (20 devices) were operated continuously in a dry nitrogen atmosphere using an inert oven (IPH-201 produced by Espec Corporation), thereby to examine the rate of capacitance change per lapse of a time so as to confirm durability thereof over a long term (Example 2). The input was 30±30 V in the form of 1 kHz sin wave. The change rate was calculated using the average of capacitances of 20 samples. The samples C were also tested in the same manner (Comparative Example 2). The result is shown in Table 1.

TABLE 1

| Driving Time | 100 hours | 1000 hours | 10000 hours |
|---|---|---|---|
| Example 2 | 0% | −0.5% | −3% |
| Comparative Example 2 | −1% | −5% | −30% |

As clear from the aforementioned description, in accordance with the piezoelectric/electrostrictive device according to the present invention and its production method, further weight reduction can be achieved, greater displacement can be ensured, speed-up of the displacing operation (higher resonance frequency) can be achieved, it is not susceptible to influence of harmful vibration, faster response is made possible, mechanical strength is enhanced, it is excellent in handleability, displacement excellent in controllability can be achieved that follows an applied electric field irrespective of change in temperature of environment of use or an element itself, or even upon use at high temperatures, so that high reliability can be ensured over a long term.

Further, the piezoelectric/electrostrictive device described above can be used as an active element such as a transducer, an actuator, a frequency region functioning component (filter), a transformer, a vibrator or a resonator for communication or power, an oscillator or a discriminator, or as a sensor element for various sensors such as an ultrasonic sensor, an acceleration sensor, angular velocity sensor, an impact sensor and a mass sensor. Particularly, it can be suitably used for various actuators used in mechanisms for adjusting displacement, position and angle of various precision components of optical equipment, precision equipment etc.

The piezoelectric/electrostrictive element according to the present invention is excellent in temperature characteristic, and low in particle occurrence rate, and has high durability, so that it is preferably used as a component of the aforementioned piezoelectric/electrostrictive device, and further, it can be used for actuator portions of electrical, electronic products etc. exposed in strict environment of use. The electrical, electronic products etc. using the piezoelectric/electrostrictive element according to the present invention can achieve longer duration of life to improve competitive strength thereof.

What is claimed is:

1. A piezoelectric/electrostrictive device comprising:

a pair of mutually confronting thin plate portions;

a fixing portion supporting said pair of thin plate portions; movable portions provided at tip end portions of said pair of thin plate portions, said movable portions having mutually confronting end surfaces; and one or more piezoelectric/electrostrictive elements disposed on at least one of said pair of thin plate portions;

wherein at least both side surfaces of said thin plate portions and said one or more piezoelectric/electrostrictive elements are covered with coating films made of a material with a low thermal expansion coefficient.

2. The piezoelectric/electrostrictive device according to claim 1, wherein said low thermal expansion coefficient material is a material selected from the group consisting of $Mo_2O_3$, $Nb_2O_5$, $U_3O_8$, $PbTiO_3$, $SrZrO_3$, $SiO_2$, $SiO_2$ added with a trace amount of $TiO_2$, and cordierite.

3. The piezoelectric/electrostrictive device according to claim 1, wherein said coating films are formed from polysilazane.

4. The piezoelectric/electrostrictive device according to claim 1, wherein a space is formed between said mutually confronting end surfaces of said movable portions.

5. The piezoelectric/electrostrictive device according to claim 1, wherein said thin plate portions, said movable portions, and said fixing portion are formed by a ceramic base body obtained by simultaneously firing and integrating ceramic green laminates.

6. The piezoelectric/electrostrictive device according to claim 5, wherein said one or more piezoelectric/electrostrictive elements are integrated with said ceramic base body by the firing.

7. The piezoelectric/electrostrictive device according to claim 1, wherein said piezoelectric/electrostrictive element is a film comprising a piezoelectric/electrostrictive layer and a pair of electrodes formed on said piezoelectric/electrostrictive layer.

8. The piezoelectric/electrostrictive device according to claim 7, wherein said piezoelectric/electrostrictive element comprising a plurality of said piezoelectric/electrostrictive layers stacked with a plurality of pairs of said electrodes.

9. The piezoelectric/electrostrictive element according to claim 7, wherein at least a pair of side surfaces of said piezoelectric/electrostrictive element that are parallel to a displacing direction are covered with said coating films and within said coating films are formed from polysilazane.

10. The piezoelectric/electrostrictive element according to claim 9, wherein said at least a pair of side surfaces of said piezoelectric/electrostrictive element that are parallel to the displacing direction are covered with said coating films, and wherein said coating films substantially consist $SiO_2$ only and each have a thickness of 0.1 $\mu$m or greater.

11. The piezoelectric/electrostrictive element according to claim 10, further comprising a plurality of said piezoelectric/electrostrictive layers and a plurality of pairs of said electrodes, wherein said piezoelectric/electrostrictive layers and said electrodes are alternately stacked such that said electrodes comprise an uppermost surface and a lowermost surface, of said piezoelectric/electrostrictive element.

* * * * *